US012777610B1

(12) United States Patent
Chen et al.

(10) Patent No.: US 12,777,610 B1
(45) Date of Patent: Oct. 27, 2026

(54) COMPUTER CABINET WITH SLIDABLE MOUNTING STRUCTURES

(71) Applicant: COOLER MASTER TECHNOLOGY INC., Taipei City (TW)

(72) Inventors: I-Hsiang Chen, Taipei City (TW); Ming-Chun Hsu, Taipei City (TW); Yung-Chun Chen, Taipei City (TW); Pei-Jung Chen, Taipei City (TW)

(73) Assignee: COOLER MASTER TECHNOLOGY INC., Taipei City (TW)

( * ) Notice: Subject to any disclaimer, the term of this patent is extended or adjusted under 35 U.S.C. 154(b) by 0 days.

(21) Appl. No.: 19/381,935

(22) Filed: Nov. 6, 2025

Related U.S. Application Data

(60) Provisional application No. 63/804,283, filed on May 12, 2025.

(51) Int. Cl.

| | |
|---|---|
| ***G06F 1/16*** | (2006.01) |
| ***H05K 5/00*** | (2025.01) |
| ***H05K 5/02*** | (2006.01) |
| ***H05K 7/00*** | (2006.01) |
| ***H05K 7/14*** | (2006.01) |
| ***H05K 7/18*** | (2006.01) |
| ***H05K 7/20*** | (2006.01) |

(52) U.S. Cl.
CPC ........... *H05K 7/183* (2013.01); *H05K 5/0221* (2013.01); *H05K 7/1401* (2013.01); *H05K 7/1417* (2013.01); *H05K 7/20172* (2013.01)

(58) Field of Classification Search
CPC .... H05K 7/183; H05K 7/1401; H05K 7/1417; H05K 7/20172; H05K 7/1409; H05K 7/1405; H05K 7/1404; H05K 7/1422; H05K 7/1427; H05K 7/1428; H05K 7/1474; H05K 5/0221
See application file for complete search history.

(56) References Cited

U.S. PATENT DOCUMENTS 5,997,117 A * 12/1999 Krietzman ............. H02B 1/301 403/219
8,413,833 B1 * 4/2013 Taylor .................... H05K 5/061 220/675

(Continued)

FOREIGN PATENT DOCUMENTS

CN 104635874 A 5/2015
WO 2008/124911 A1 10/2008

OTHER PUBLICATIONS

Partial European Search Report, European Patent Application No. EP 25218215.9, European Patent Office, dated May 13, 2026.

*Primary Examiner* — Anthony M Haughton
(74) *Attorney, Agent, or Firm* — Merchant & Gould P.C.

(57) ABSTRACT

A computer cabinet comprises a main frame including a plurality of frame beams, a mounting platform configured to support electronic components, a plurality of first guide rails mounted to the frame beams, and a plurality of first sliders. Each first slider is slidably coupled to a corresponding first guide rail, and the mounting platform is coupled to the plurality of first sliders such that the mounting platform is configured to slide along the plurality of first guide rails. The slidable mounting platform provides enhanced assembly flexibility by enabling positional adjustment of electronic components during assembly processes.

18 Claims, 32 Drawing Sheets

(56) References Cited

U.S. PATENT DOCUMENTS

| | | | | |
|---|---|---|---|---|
| 2008/0258587 | A1* | 10/2008 | Mayuzumi | B65D 21/08 312/111 |
| 2014/0211410 | A1* | 7/2014 | Cary | G06F 1/20 361/679.6 |
| 2014/0240920 | A1 | 8/2014 | Cox et al. | |
| 2015/0002006 | A1* | 1/2015 | Segroves | H05K 7/1488 312/265.6 |
| 2017/0150636 | A1* | 5/2017 | Segroves | H05K 7/1488 |
| 2017/0223864 | A1* | 8/2017 | Jost | A47B 88/43 |
| 2022/0312616 | A1* | 9/2022 | Comtois | H02B 1/36 |
| 2024/0268055 | A1 | 8/2024 | Li | |

* cited by examiner

COMPUTER CABINET WITH SLIDABLE MOUNTING STRUCTURES

INCORPORATION BY REFERENCE

This application claims the benefit of U.S. Provisional Application No. 63/804,283, filed on May 12, 2025, which is incorporated herein by reference in its entirety.

TECHNICAL FIELD

The present disclosure relates to computer cabinet having structures for supporting or fixing internal components.

BACKGROUND

A modern computer cabinet typically exhibits several notable features. The cabinet comprises a rigid and durable framework, which is often constructed from high-strength metal alloys or engineered plastics, to ensure stability and protection for internal components. The cabinet can accommodate structures for support or fixing internal components, such as a motherboard, a graphics processing unit (GPU) assembly, and the like. Additionally, the cabinet provides other structures, such as cable management channels and grommets, ventilation openings, and integrated cooling fans, which ensure reliable and efficient performance of the computer system housed within the cabinet.

SUMMARY

Aspects of the disclosure provide a computer cabinet. The computer cabinet can include a main frame including a plurality of frame beams, a mounting platform configured to support electronic components, a plurality of first guide rails mounted to the frame beams, and a plurality of first sliders. Each first slider is slidably coupled to a corresponding first guide rail of the plurality of first guide rails. The mounting platform is coupled to the plurality of first sliders such that the mounting platform is configured to slide along the plurality of first guide rails.

In an embodiment, the computer cabinet further includes a locking mechanism associated with at least one first slider of the plurality of first sliders. The locking mechanism is configured to selectively inhibit movement of the at least one first slider along the corresponding first guide rail.

In an example, the locking mechanism includes a manual cam lock including a lever connected to an eccentric cam coupled to an axis. Upon pushing the lever down, the eccentric cam rotates and presses against the corresponding first guide rail, creating a clamping pressure between the at least one first slider and the corresponding first guide rail to inhibit motion of the at least one first slider along the corresponding first guide rail.

In an example, the plurality of first guide rails comprises four first guide rails mounted to the frame beams at a frontside and a backside of the computer cabinet, and the plurality of first sliders comprises four first sliders, each slidably coupled to a corresponding one of the four first guide rails. The mounting platform comprises a rectangular frame including a frontside beam, a backside beam, an upper beam, a bottom beam, and a middle beam.

In an embodiment, the computer cabinet further includes a cover bracket attached to the frame beams on a side opposite to at least one first guide rail of the plurality of first guide rails. The cover bracket aligns with the at least one first guide rail and is configured to conceal the at least one first guide rail and a corresponding first slider of the plurality of first sliders.

In an embodiment, the computer cabinet further includes a fan and radiator mounting assembly. The fan and radiator mounting assembly includes a pair of second guide rails, each second guide rail mounted to opposing frame beams and having an elongated slide slot disposed on a portion thereof, a pair of support beams configured to support fan and radiator components, a plurality of second sliders, each second slider engaged with a corresponding second guide rail of the pair of second guide rails. The pair of support beams are coupled to the plurality of second sliders such that the support beams are configured to slide along the corresponding second guide rail. A distance between the pair of support beams is adjustable by sliding at least one of the support beam along the elongated slide slot.

In an example, each second slider includes a threaded hole and a through hole. Each support beam includes a first through hole and a second through hole at one end thereof. A first screw fastener passes through the first through hole of the support beam and threadedly engages with the threaded hole of the corresponding second slider to couple the support beam to the second slider. A second screw fastener passes through the second through hole of the support beam, through the through hole of the second slider, and through the elongated slide slot, and engages with a positioning block. Upon tightening the second screw fastener, the support beam and the second slider are secured to the second guide rail rendering them immobile, and upon loosening the second screw fastener, the support beam and the second slider can slide along the second guide rail. In an example, at least one of the second guide rails includes elongated slide slots on opposing sides, thereby enabling both support beams to slide along respective slide slots.

In an embodiment, the computer cabinet further includes a pair of opposing frame beams, a pair of third guide rails coupled to the pair of opposing frame beams, respectively, a plurality of third sliders, each third slider engaged with a corresponding third guide rail of the plurality of third guide rails, each third slider including a threaded positioning hole, and at least one support beam coupled to at least two third sliders engaged with different third guide rails. The at least one support beam is configured to slide along the plurality of third guide rails. In an embodiment, the computer cabinet further includes a plurality of positioning fasteners. Each positioning fastener is configured to be threaded through a corresponding threaded positioning hole of one of the third sliders. Upon tightening a positioning fastener through the threaded positioning hole, opposing edges along a length of the third slider press against opposing edges of the corresponding third guide rail, and a tip of the positioning fastener pushes against the corresponding third guide rail, thereby inhibiting movement of the third slider along the corresponding third guide rail.

In an embodiment, the computer cabinet further includes a dual-layer slidable mounting structure that includes a base layer comprising a base layer guide rail coupled to a frame beam of the plurality of frame beams, and a base layer slider slidably engaged with the base layer guide rail, the base layer slider including threaded holes, and an upper layer disposed on the base layer, the upper layer comprising an upper layer guide rail coupled to the base layer slider through the threaded holes, and an upper layer support structure mounted to the upper layer guide rail. Loosening a fastener coupling the base layer slider to the base layer guide rail allows the entire upper layer to slide along the base layer guide rail as a unit.

In an example, the upper layer guide rail includes an elongated slide slot disposed on a portion thereof, and the upper layer support structure comprises a fan and radiator mounting assembly including at least one support beam configured to support fan and radiator components, and at least one upper layer slider engaged with the upper layer guide rail. The at least one support beam is coupled to the at least one upper layer slider such that the at least one support beam is configured to slide along the elongated slide slot of the upper layer guide rail for adjustable positioning of fan and radiator components.

In an embodiment, the computer cabinet further includes a plurality of motherboard bracket assemblies. Each motherboard bracket assembly includes a support beam coupled to two opposing frame beams of the plurality of frame beams. The support beam has an elongated slide slot extending in a length direction of the support beam. A width of the slide slot is narrower at two ends than at a middle portion. Each motherboard bracket assembly further includes two fourth sliders configured at opposing sides of the support beam, a slide bracket arranged at an inner side of the support beam, and fasteners passing through the fourth sliders and the slide slot to engage with the slide bracket. Loosening the fasteners allows the slide bracket and the fourth sliders to slide along the slide slot for adjustable positioning.

In an example, the computer cabinet further includes a motherboard tray coupled to the plurality of motherboard bracket assemblies, and a backside panel coupled to at least two motherboard bracket assemblies of the plurality of motherboard bracket assemblies. The slide bracket includes threaded holes and protrusions configured for mounting the motherboard tray and the backside panel, and the motherboard tray and the backside panel are repositionable by sliding the slide brackets along the slide slots of the respective motherboard bracket assemblies.

In an embodiment, the computer cabinet further includes a plurality of guiding frame beams, each guiding frame beam having a flange with an elongated slide slot adjacent to a guide rail formed as part of the flange, and a plurality of support beams. For each support beam, the computer cabinet further includes a fifth slider arranged below the guide rail of a corresponding guiding frame beam, the fifth slider including a first threaded nut, a second threaded nut, a tongue structure with a rubber pad arranged at an edge of the tongue structure, and protrusions formed at an edge of the fifth slider extending upward, a slider holder positioned above the guide rail and opposing the slider, the slider holder including a protrusion with an edge, and a first fastener passing through the support beam and the slider holder and engaging with the first threaded nut to couple the support beam, slider holder, and slider together with the guide rail positioned between the slider holder and the slider.

In an example, the computer cabinet further includes, for each support beam, a second fastener passing through the support beam and the slider holder and engaging with the second threaded nut. Upon tightening the second fastener, the rubber pad is pushed upward against a surface of the flange of the corresponding frame beam, thereby inhibiting movement of the slider along the guide rail, and upon loosening the second fastener, the slider, slider holder, and support beam can slide along the guide rail with the protrusions of the slider and the edge of the slider holder respectively touching opposing inner surfaces of the slide slot for enhanced stability.

In an example, the computer cabinet further includes a plurality of guiding frame beams, each guiding frame beam having a flange including a slide slot and a guide rail, a plurality of support beams, and, for each support beam, a knob assembly configured to affix the support beam to a corresponding guiding frame beam. The knob assembly includes a knob having a lever arm with one or more guiding protrusions extending outward along an axial direction of the lever arm, a spring, a rubber pad having one or more protrusions extending downward and a through hole with recesses on sidewalls that match with the guiding protrusions, a base having openings that receive the protrusions of the rubber pad and a through hole with recesses on sidewalls that match with the guiding protrusions, and a fastener. The lever arm passes through the spring, a through hole of the support beam, the slide slot, and the through holes of the rubber pad and the base to engage with the fastener. Pushing the knob downward and rotating the knob causes the rubber pad and the base to rotate along with the knob due to the guiding protrusions and matching recesses, Releasing the knob causes the spring to exert a press force that clamps the rubber pad towards a surface of the flange of the frame beam, thereby securing the support beam in position.

Aspects of the disclosure provide another computer cabinet. The computer cabinet includes a main frame including a plurality of frame beams, a plurality of motherboard bracket assemblies. Each motherboard bracket assembly includes a support beam coupled to two opposing frame beams of the plurality of frame beams, the support beam having an elongated slide slot extending in a length direction of the support beam, a width of the slide slot being narrower at two ends than at a middle portion, two sliders configured at opposing sides of the support beam, a slide bracket arranged at an inner side of the support beam, and fasteners passing through the sliders and the slide slot to engage with the slide bracket. Loosening the fasteners allows the slide bracket and the sliders to slide along the slide slot for adjustable positioning.

In an example, the computer cabinet further includes a motherboard tray coupled to the plurality of motherboard bracket assemblies, and a backside panel coupled to at least two motherboard bracket assemblies of the plurality of motherboard bracket assemblies. The slide bracket includes threaded holes and protrusions configured for mounting the motherboard tray and the backside panel, and the motherboard tray and the backside panel are repositionable by sliding the slide brackets along the slide slots of the respective motherboard bracket assemblies.

Aspects of the disclosure provide another computer cabinet. The computer cabinet includes a main frame including a plurality of frame beams, each frame beam having a flange including a slide slot and a guide rail, a plurality of support beams, and, for each support beam, a knob assembly configured to affix the support beam to a corresponding frame beam. The knob assembly includes a knob having a lever arm with one or more guiding protrusions extending outward along an axial direction of the lever arm, a spring, a rubber pad having one or more protrusions extending downward and a through hole with recesses on sidewalls that match with the guiding protrusions, a base having openings that receive the protrusions of the rubber pad and a through hole with recesses on sidewalls that match with the guiding protrusions, and a fastener.

The lever arm passes through the spring, a through hole of the support beam, the slide slot, and the through holes of the rubber pad and the base to engage with the fastener. Pushing the knob downward and rotating the knob causes the rubber pad and the base to rotate along with the knob due to the guiding protrusions and matching recesses. Releasing the knob causes the spring to exert a press force that clamps the rubber pad towards a surface of the flange of the frame beam, thereby securing the support beam in position.

BRIEF DESCRIPTION OF THE DRAWINGS

Various embodiments of this disclosure that are proposed as examples will be described in detail with reference to the following figures, wherein like numerals reference like elements, and wherein:

FIGS. 17A-1, 17B-1, 18A-1, and 18B-1 show similar structures and components as FIGS. 17A, 17B, 18A, and 18B, but with different configurations of the backside panel 61 and the motherboard tray 161.

FIG. 19-1 and FIG. 19-2 show further details of the motherboard bracket assembly 6.

FIGS. 20A-1 and 20B-1 show similar structures and components as FIGS. 20A-1 and 20B-1, however, with different configurations of the backside panel 61 and motherboard tray 161.

DETAILED DESCRIPTION OF EMBODIMENTS

Figure 1:
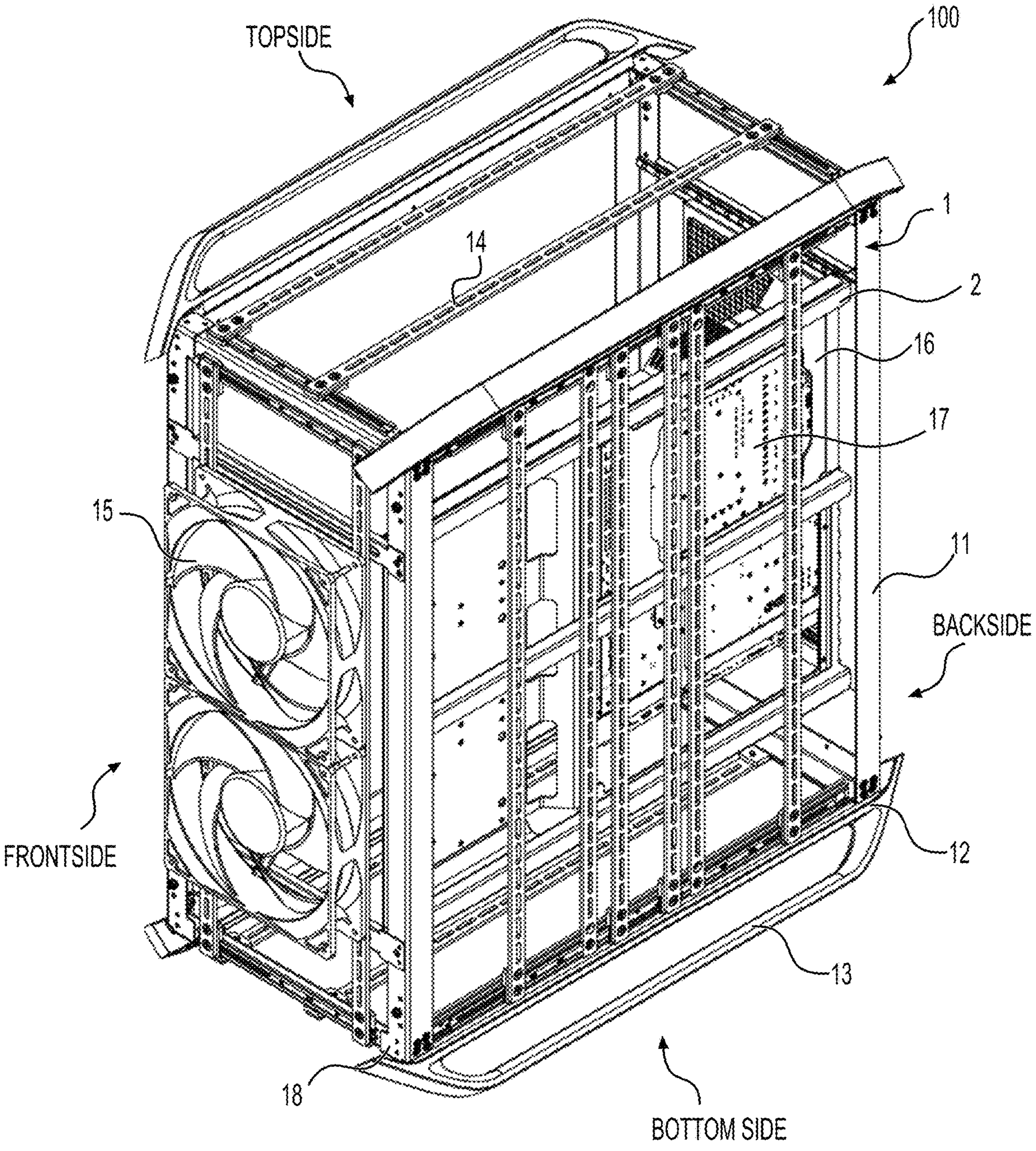
FIG. 1 shows a computer cabinet 100 having a main frame 1 and support beams 14 attached to the main frame 1.

FIG. 1 shows a computer cabinet 100 having a main frame 1 and support beams 14 attached to the main frame 1. Electronic components, such as fans 15 and a motherboard 17, and structures for supporting or mounting electronic components, such as a motherboard tray 16 and a mounting platform 2, can be directly or indirectly attached to the main frame 1 or the respective support beams 14. Cover plates or panels (not shown) of the computer cabinet 100 can be attached to the main frame 1 or the support beams 14 to enclose the components or structures of a computer system.

The main frame 1 has eight frame joints 18 at eight corners and twelve frame beams 11 and 12 each positioned between two corresponding frame joints 18. There are two types of frame beams. The first type of frame beams 11 include four frame beams 11 at the frontside and four frame beams 11 at the backside of the computer cabinet 100. The second type of frame beams 12, each having a handle 13 (or a foot base 13), are positioned between the frontside and the backside of the computer cabinet 100. The support beams 14 can be attached to the respective frame beams 11 and 12 at the frontside, backside, topside, bottom side, left side and/or right side of the computer cabinet 100.

In the present disclosure, the left side or right side is with respect to a user facing the frontside of the computer cabinet 100. A vertical direction refers to the direction perpendicular to the topside and bottom side of the computer cabinet.

Figure 2:
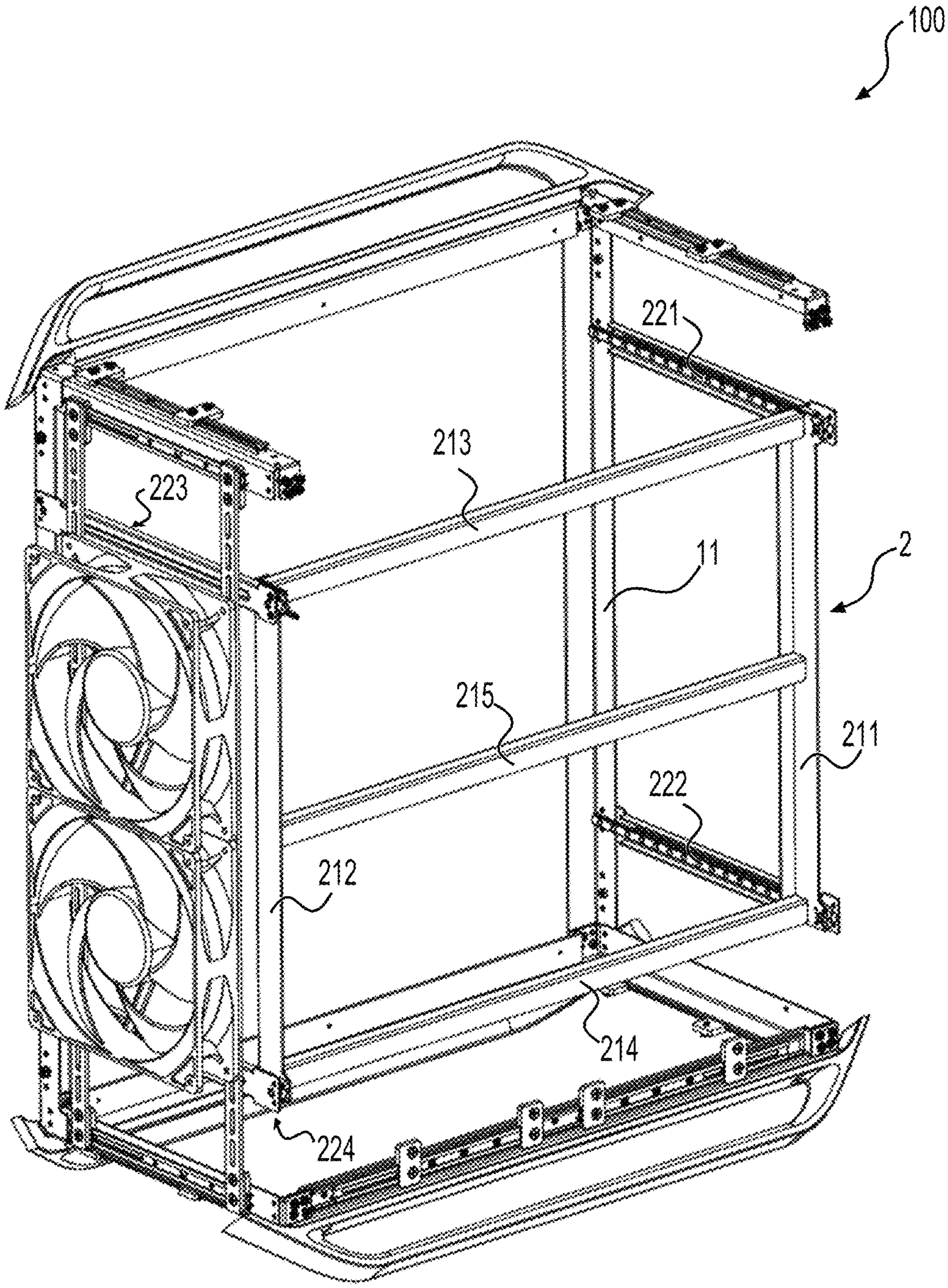
FIG. 2 shows a mounting platform 2 according to an embodiment of the present disclosure.

FIGS. 2-5 show a first type of slidable mounting structure. FIG. 2 shows a mounting platform 2 according to an embodiment of the present disclosure. The mounting platform 2 functions as a structure for mounting the motherboard tray 16 or the motherboard 17. In the FIG. 2 example, the mounting platform 2 takes the form of a rectangular frame formed by several beams (a backside beam 211, a frontside beam 212, an upper beam 213, a bottom beam 214, and a middle beam 215). In other examples, the mounting platform 2 can take the forms of a panel, a tray, or a wall, or any other forms suitable for mounting electronic components in the computer system.

The mounting platform 2 is coupled to several guide rails 221-224 via a sliding mechanism. During an assembly process of the computer system, the mounting platform 2 can slide along the guide rails 221-224 such that the mounting platform 2 can be easily adjusted to a suitable position to accommodate a motherboard or other electronic or non-electronic components within the computer cabinet 100. In the example of FIG. 2, the guide rails 221-224 are mounted to the frame beams 11 at the frontside and backside of the computer cabinet 100. The guide rails 221-224 can be mounted onto the main frame 1 or frame beams 11 and 12 located at any side of the computer cabinet in other examples. Depending on the configurations, the mounting platform 2 can be arranged in other orientations different from the orientation shown in FIG. 2. For example, the mounting platform 2 can be arranged in parallel to the frontside or the bottom side of the computer cabinet 100.

Figure 3:
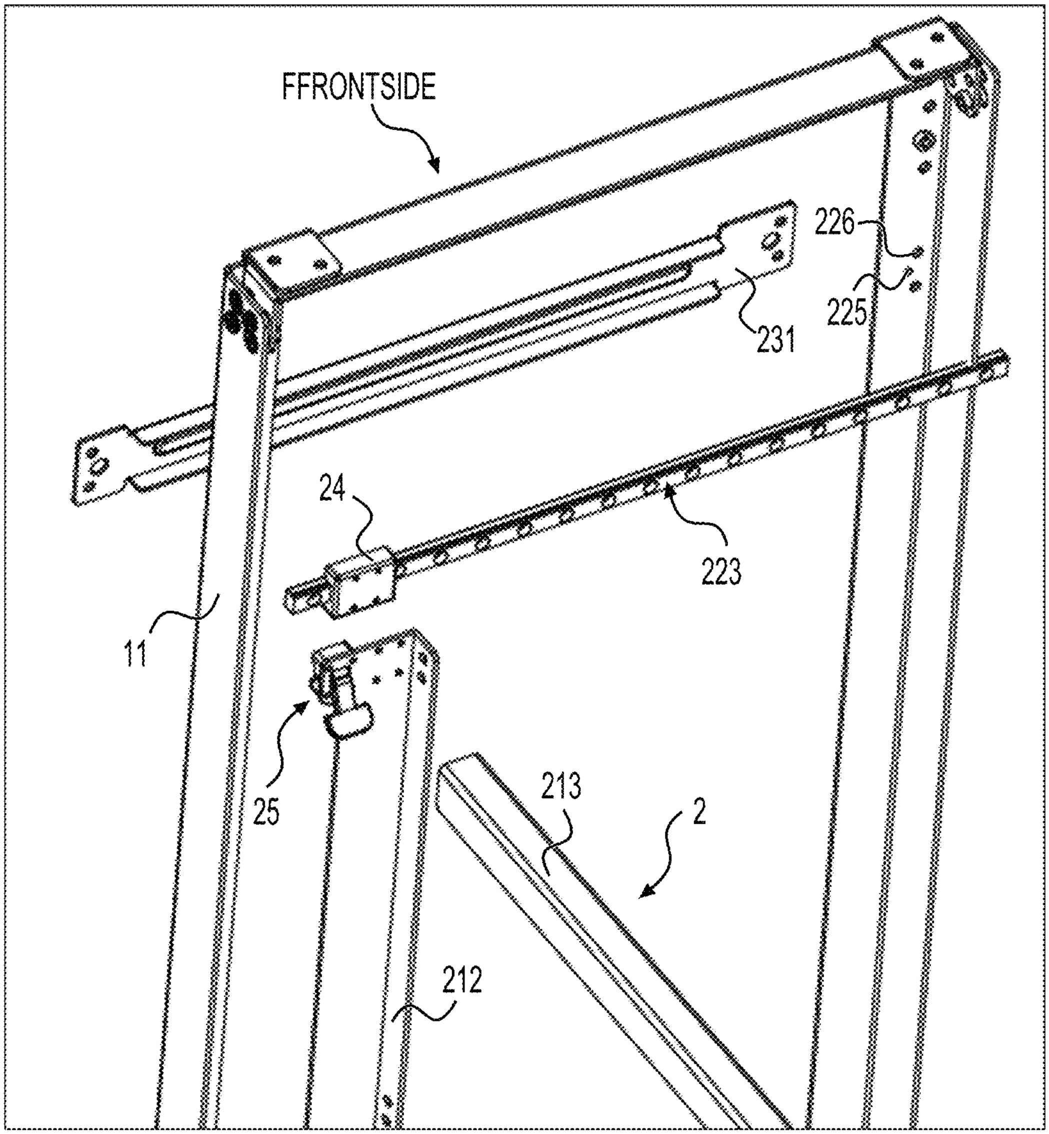
FIG. 3 shows the details of the sliding mechanism employed by the mounting platform 2.

FIG. 3 shows the details of the sliding mechanism employed by the mounting platform 2. The frame beams 11 each have two flanges that form an L-shape when viewed in cross-section. Screw holes 225 and 226 are formed on respective flanges. The guide rail 223 is attached to two frame beams 11 at the frontside of the computer cabinet 100 via screw holes 225 (or other fastening methods). A cover bracket 231 is also attached to the two frame beams 11 via screw holes 226 but on the side opposite to the guide rail 223. The cover bracket 231 aligns with the guide rail 223, conceals the guide rail 223, a slider 24 attached to the guide rail 223, and the screw holes 225 to enhance the aesthetic appearance of the computer cabinet 100. In addition, the cover bracket 231 prevents the internal components from being accidentally removed during maintenance.

As shown in FIG. 3, The slider 24 can slide along the guide rail 223. Various combinations of sliders and respective guide rails employing various technologies can be adopted herein. Each of the guide rails 221-224 can be configured with a slider 24. The mounting platform 2 can be affixed to these sliders 24 so that the mounting platform 2 can slide under the guiding of the guide rails 221-224. In the example of FIG. 3, the front beam 212 of the mounting platform 2 is mounted on the top surface of the slider 24 facing inwardly to the inside of the computer cabinet 100. The top beam 213 of the mounting platform 2 is mounted to the front beam 212. In this manner, the mounting platform 2 can be attached to the four sliders 24 on the four guide rails 221-224 and slide along the four guide rails 221-224. The slider 24 can be made of a material with low friction, high stiffness, and high wear resistance. In an example, the slider 24 is made of a thermoplastic polymer, such as Polyoxymethylene (POM).

Figure 4:
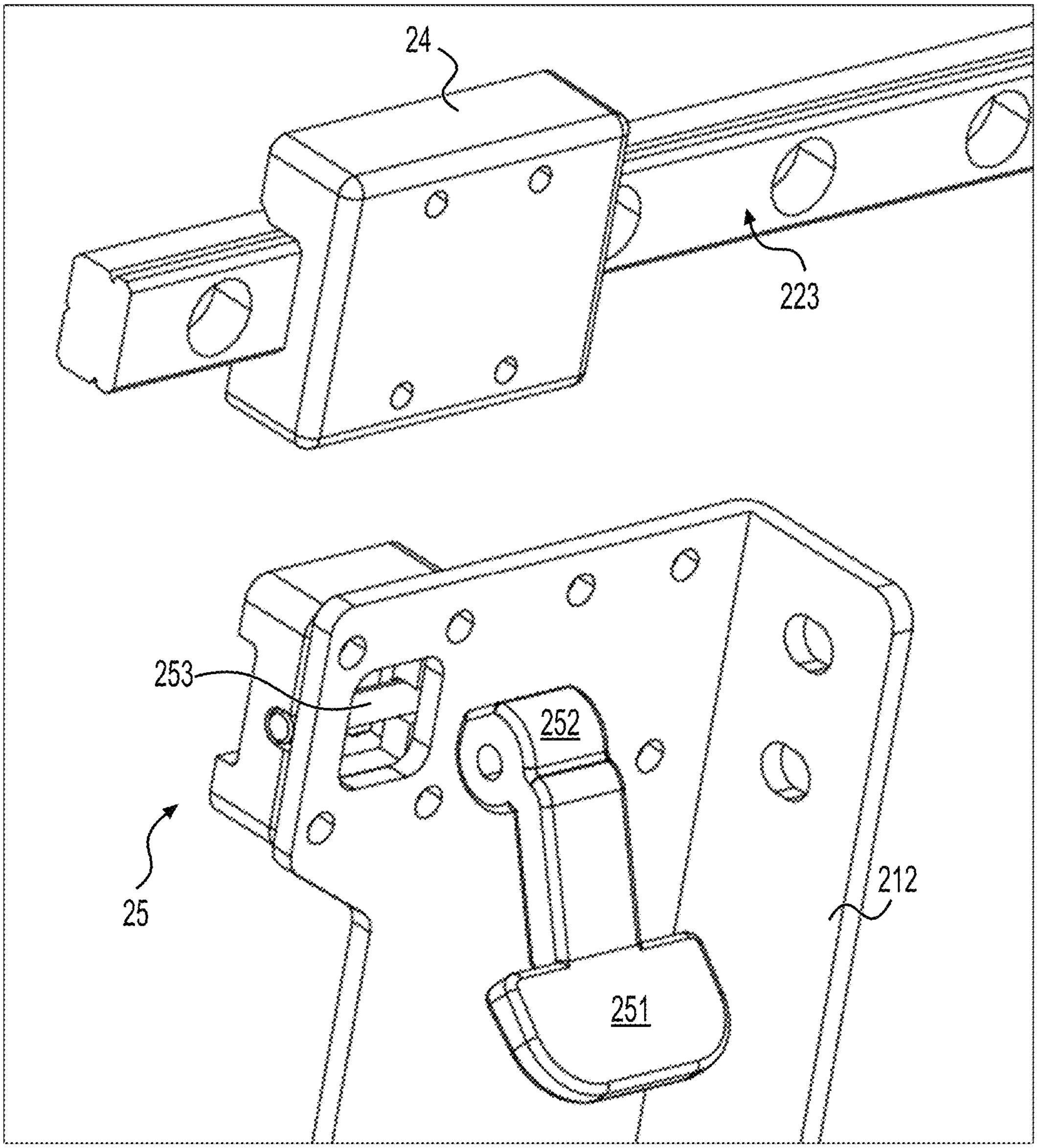
FIG. 4 shows an example of the manual locking mechanism 25 being a manual cam lock 25.

Corresponding to each slider 24, a manual locking mechanism 25 is configured and, when activated, can lock the respective slider 24 from moving along the respective guide rail 221-224. FIG. 4 shows an example of the manual locking mechanism 25 being a manual cam lock 25. The manual cam lock 25 includes a lever 251 connected to an eccentric cam 252 coupled to an axis 253. When the lever 251 is pushed down, the eccentric cam 252 rotates and presses against the guide rail 223. This pushes the slider 24 away from the guide rail 223 and thus creates a clamping pressure between the slider 24 and the guide rail 223 to inhibit motion of the slider 24 along the guide rail 223. When the lever 251 is pushed up, the eccentric cam 252 is disengaged to release the slider 24 and then the slider 24 can move freely along the guide rail 223.

The manual locking mechanism 25 allows tool-less positional adjustment of the slider 24 along the guide rail 223, enhancing the simplicity of assembly of components within the computer cabinet 100. In various examples, various manual locking mechanisms can be employed. In the example of FIG. 4, the manual lock mechanism 25 is formed on one end of the frontside beam 212 of the motherboard mounting platform 2, where the slider 24 is coupled with; in other examples, the manual locking mechanism 25 can be integrated into the slider 24 and become part of the slider 24, or can be attached to the slider 24 without passing through the frontside beam 212. Furthermore, in FIG. 3, the flanges of the vertical frame beams 11 on the left side or right side of the computer cabinet 100 can be configured to be wide enough to conceal the lever 251, thereby enhancing the aesthetic appeal of the computer cabinet 100 while also increasing the strength of the frame beams.

Figure 5:
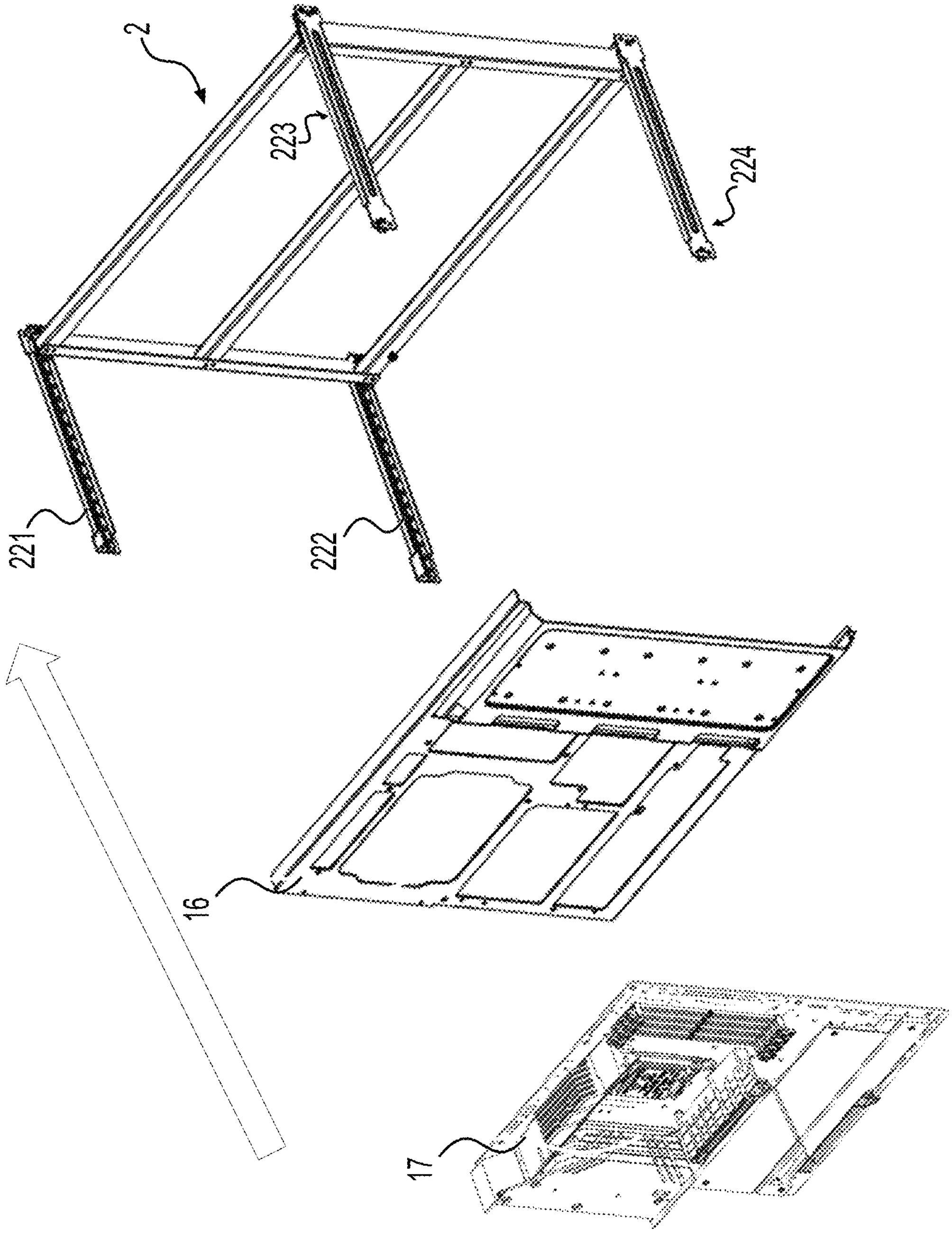
FIG. 5 shows an assembly relationship between the motherboard 17, the motherboard tray 16, and the motherboard mounting platform 2.

FIG. 5 shows an assembly relationship between the motherboard 17, the motherboard tray 16, and the motherboard mounting platform 2. During an assembly process, the motherboard mounting platform 2 can flexibly slide along the guide rails 221-224. Components or structures can be mounted to either side of the motherboard mounting platform 2 (either the left side or the right side of the motherboard mounting platform 2). As an example, the motherboard 17 can first be mounted to the motherboard tray 16. Then, the assembled components 16 and 17 can be mounted to the motherboard mounting platform 2. Usage of the motherboard mounting platform 2 is not limited to motherboard mounting. Any suitable components other than the components 16 and 17 can be mounted onto the motherboard mounting platform 2, taking advantage of the assembly flexibility of the motherboard mounting platform. In one example, the guide rail 221-224 has a travel distance of around 200 mm for adjusting the position of the motherboard mounting platform 2.

Figure 6:
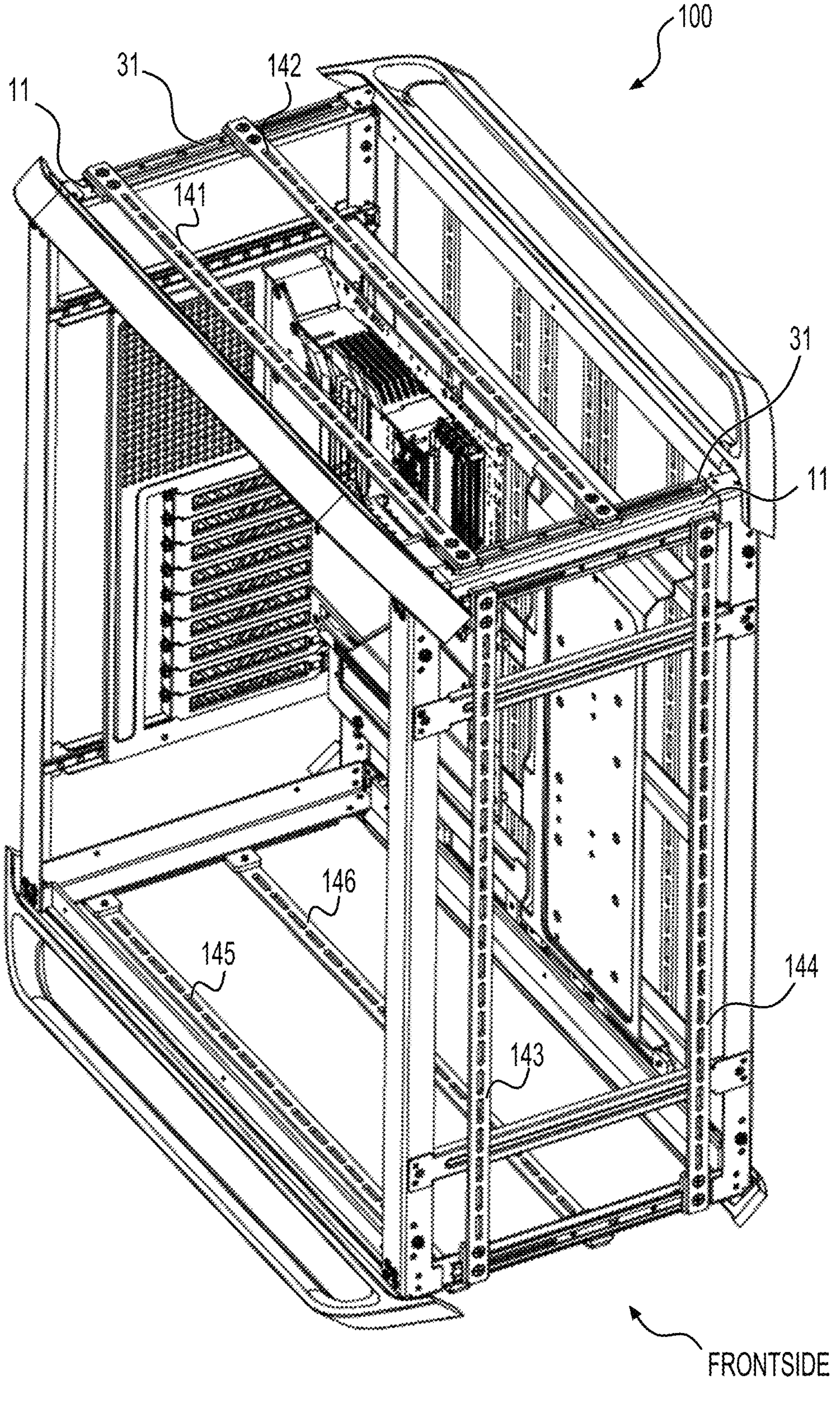
FIG. 6 shows slidable support beams 141-146 installed on the computer cabinet 100 according to an embodiment of the disclosure.
Figure 7:
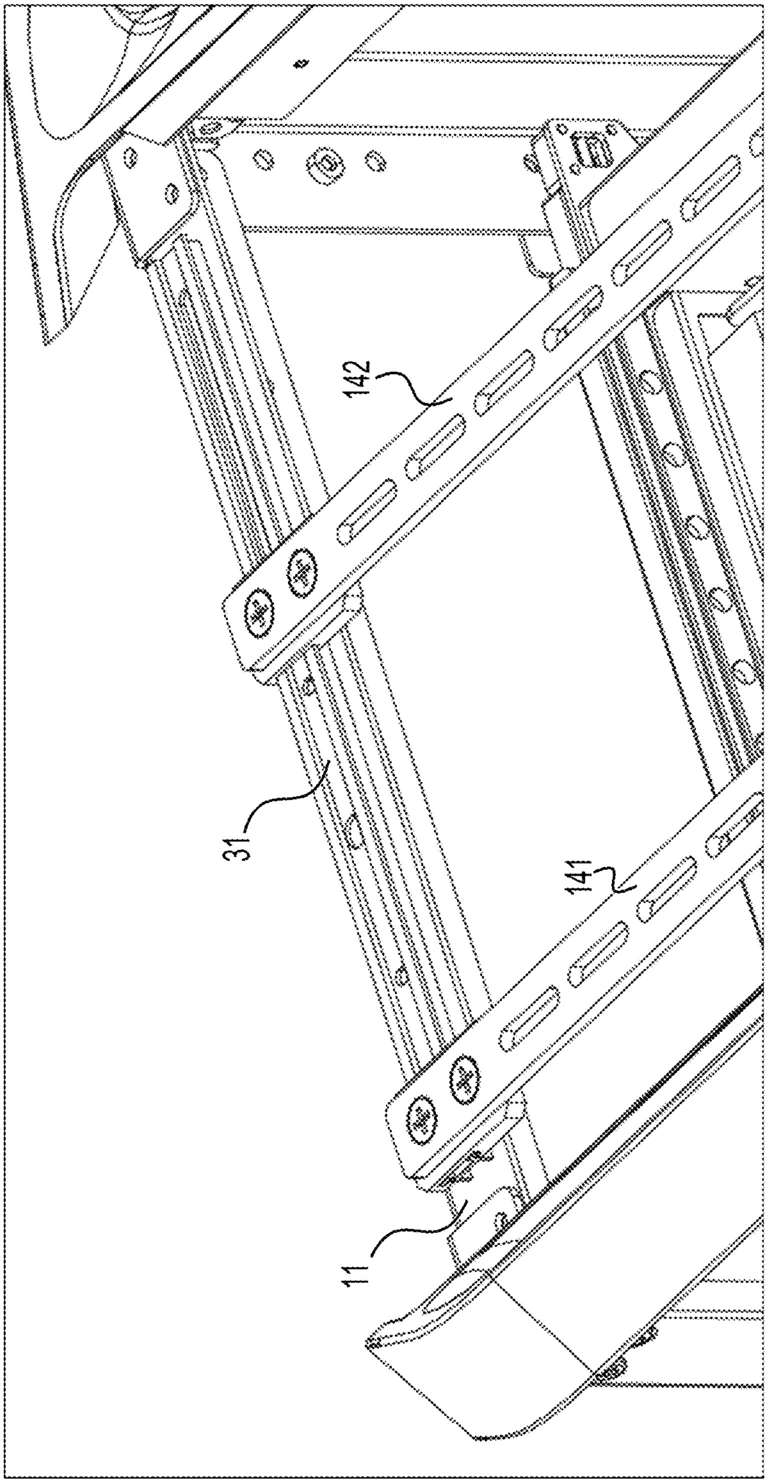
FIG. 7 shows a zoomed-in partial view of the topside of the computer cabinet 100.

FIGS. 6-11 show a second type of slidable mounting structure. FIG. 6 shows slidable support beams 141-146 installed on the computer cabinet 100 according to an embodiment of the disclosure. FIG. 7 shows a zoomed-in partial view of the topside of the computer cabinet 100. On the topside of the computer cabinet 100, a pair of guide rails 31 are respectively disposed on a pair of opposing frame beams 11. A pair of support beams 141 and 142 are attached to the pair of guide rails 31. On the frontside of the computer cabinet 100, a pair of support beams 143 and 144 are attached to a pair of guide rails 31 disposed on a pair of opposing frame beams 11, respectively. On the bottom side of the computer cabinet 100, a pair of support beams 145 and 146 are attached to a pair of guide rails 31 (not shown) disposed on a pair of opposing frame beams 11, respectively. Similarly, such slidable support beams can be configured to be positioned at any side of the computer cabinet 100.

The paired support beams, such as the pair of support beams 141 and 142, can also be a mounting bracket for mounting fans and radiators. According to the disclosure, at least one support beam in a pair of support beams can slide along the respective guide rails 31. This increase the flexibility of adjustment in the space between the paired support beams to match with various form factors of fan or radiator equipment during an assembly process, enhancing the simplicity of use of the computer cabinet 100.

Figure 8:
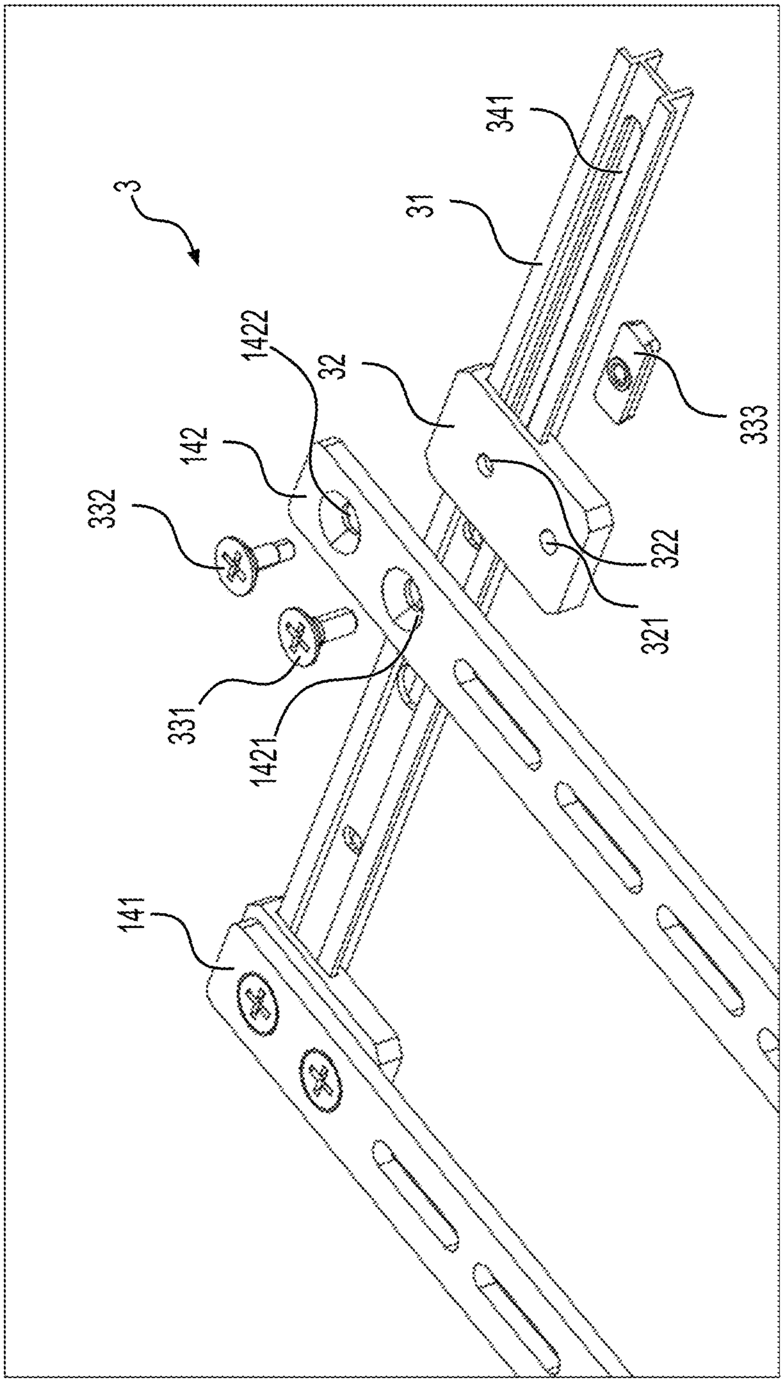
FIG. 8 shows a top perspective view of a portion of a fan and radiator (FR) mounting assembly 3.
Figure 9:
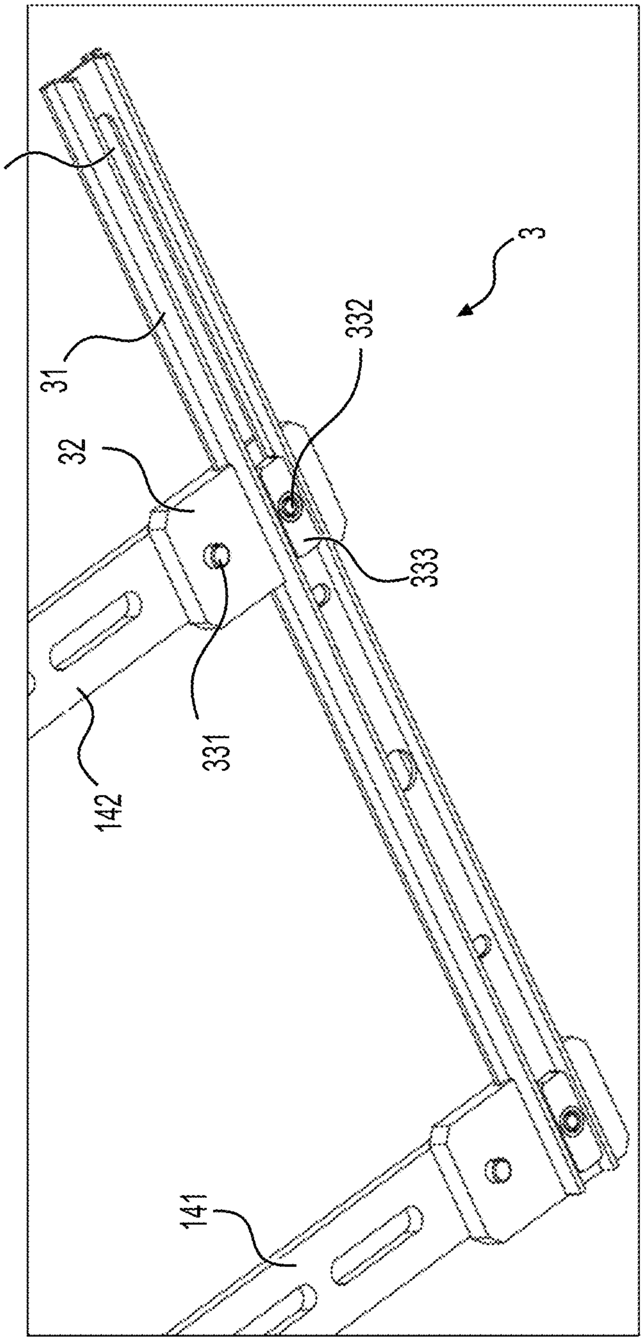
FIG. 9 shows a bottom perspective view of the portion of the FR mounting assembly 3.

FIGS. 8 and 9 show further details of the second type of slidable mounting structure. FIG. 8 shows a top perspective view of a portion of a fan and radiator (FR) mounting assembly 3. FIG. 9 shows a bottom perspective view of the portion of the FR mounting assembly 3. As shown, the guide rail 31 has an elongated slide slot 341 deposed on a portion of the guide rail 31. A slider 32 is engaged with the guide rail 31. The slider 32 has a threaded hole 321 and a through hole 322. The support beam 142 has two through holes 1421 and 1422 at one end thereof. A screw fastener 331 passes through the through hole 1421 and threadedly engages with threaded hole 321, so that the support beam 142 is coupled to the slider 32. However, the embodiment is not limited thereto when other fixing methods are applicable.

Another screw fastener 332 passes through the through hole, 1422, through hole 322, and the slide slot 341, and then engages with a positioning bock 333. Upon tightening the screw fastener 332, the support beam 142 and the slider 32 are secured to the guide rail 31, rendering them immobile. When the screw fastener 332 is loosened, the support beam 142 and the slider 32 can slide along the guide rail 31 due to the configuration of the slide slot 341. The support beam 141 is secured to the guide rail 31 in a manner similar to the support beam 142 by employing a similar set of components (slider, positioning block, and fasteners). Instead of the slide slot 341, a through hole 340 (shown in FIG. 10A) is employed for fastening the support beam 141.

In one example, by positioning the support beam 142 at any position along the slide slot 341, the distance between the support beams 141 and 142 can be adjusted in arrange between 105 mm and 170 mm. Thus, the FR mounting assembly 3 can be compatible with fans of a size (diameter) between 120 mm and 200 mm.

In one example, the slider 32 is made of POM. The guide rail 31 is made of aluminum extrusion. The support beams 141-146 are made of iron or steel. The positioning bock 333 is made of plastic with a bass nut embedded therein.

Figure 10A:
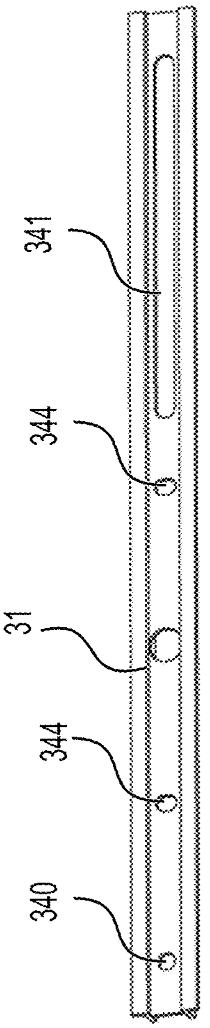
FIG. 10A shows the single-side slidable guide rail 31 with the slide slot 341 and the through hole 340.

FIG. 10A shows the single-side slidable guide rail 31 with the slide slot 341 and the through hole 340. Additionally, the guide rail 31 further includes one or more through holes 344 for fixing the guide rail 31 to a frame beam 11 or another layer of slidable mounting structure described below.

Figure 10B:
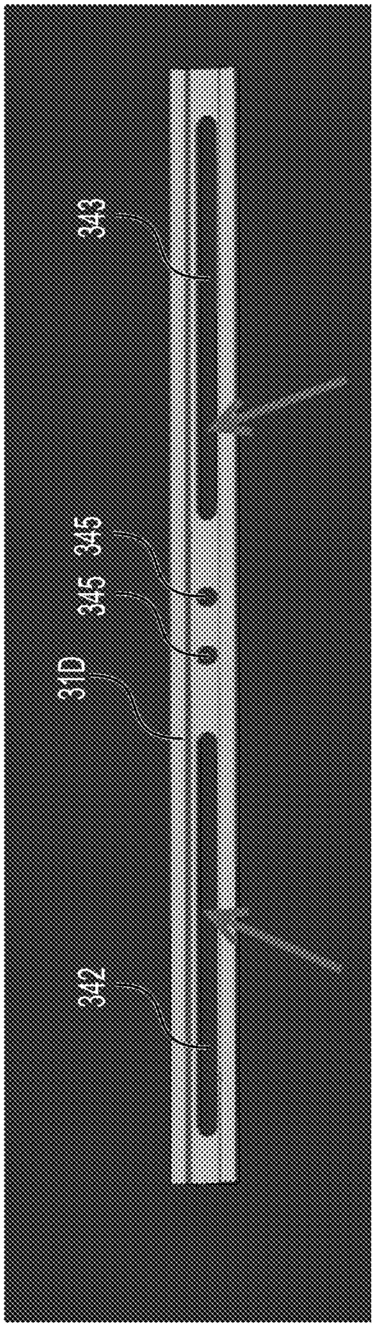
FIG. 10B shows a dual-sides slidable guide rail 31D that includes two slide slots 343.

FIG. 10B shows a dual-sides slidable guide rail 31D that includes two slide slots 343. The configuration of two slide slots 342 allows two slidable support beams in an FR mounting assembly, which not only extends the range of the adjustable distance between the two support beams, but also enhancing the positioning flexibility of an FR mounting assembly (allowing the FR mounting assembly as a whole to move to any position along the two slide slots 342 and 343).

Figure 11:
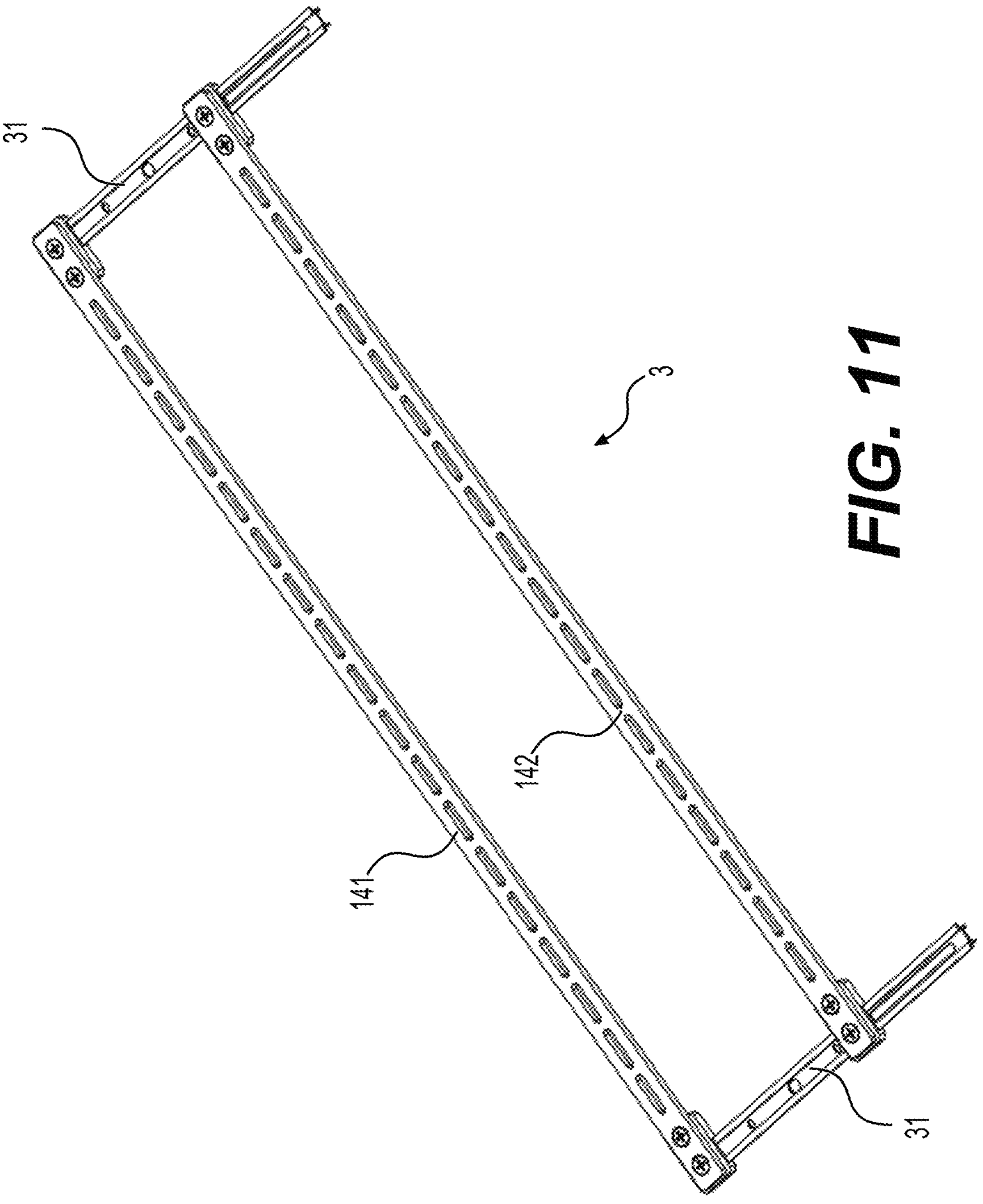
FIG. 11 shows the FR mounting assembly 3 with two support beams 141 and 142 and two one-side slidable guide rails 31.

FIG. 11 shows the FR mounting assembly 3 with two support beams 141 and 142 and two one-side slidable guide rails 31. The FR mounting assembly 3 can be referred to as a one-side slidable FR mounting assembly. Replacing the two one-side slidable guide rails 31 with two two-side slidable guide rails 31D results in a dual-sides slidable FR mounting assembly, enabling both support beams to move along the respective slide slots.

Figure 12:
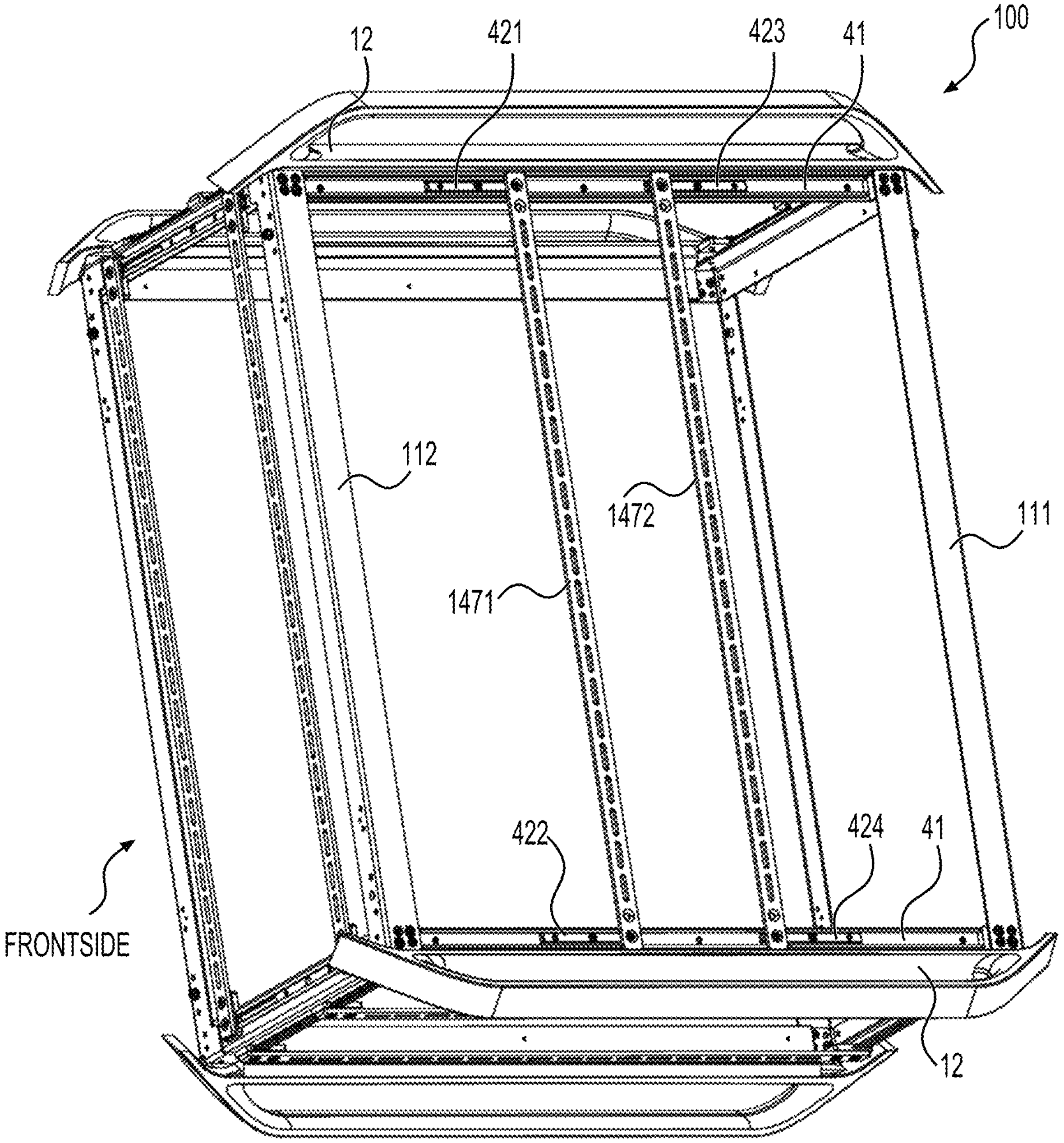
FIG. 12 shows slidable support beams 1471 and 1472 installed on the computer cabinet 100 according to an embodiment of the disclosure.
Figure 13:
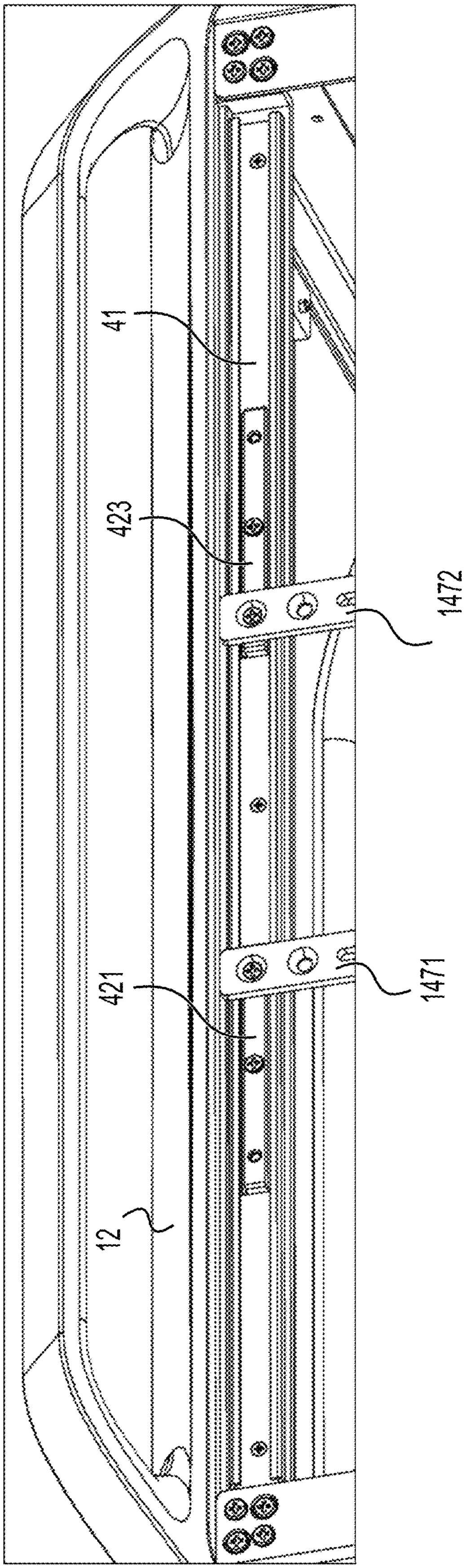
FIG. 13 shows a zoomed-in partial view of the right side of the computer cabinet 100.
Figure 14:
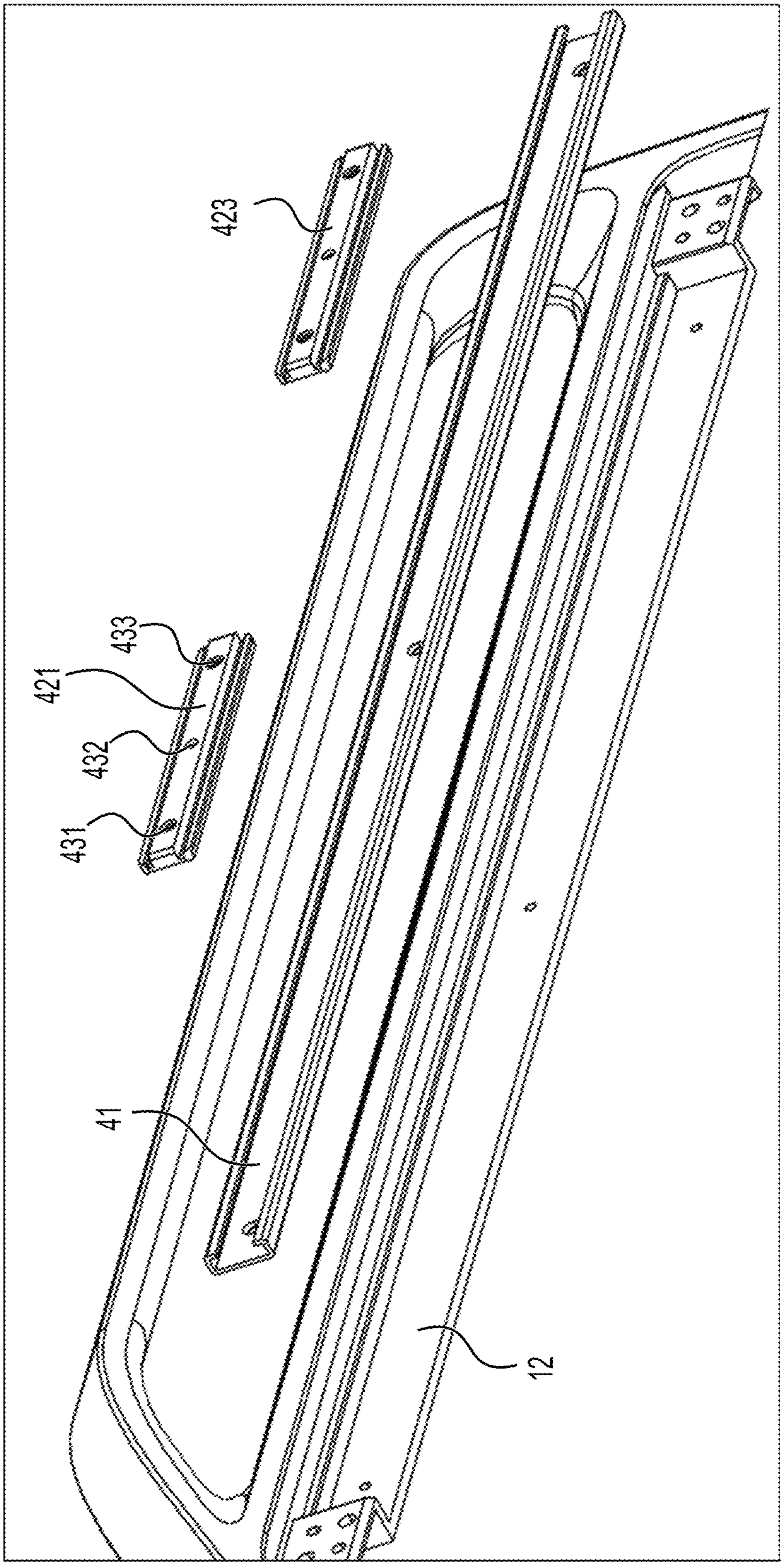
FIG. 14 shows further details about the third type of slidable mounting structure.

FIGS. 12-14 show a third type of slidable mounting structure. FIG. 12 shows slidable support beams 1471 and 1472 installed on the computer cabinet 100 according to an embodiment of the disclosure. FIG. 13 shows a zoomed-in partial view of the right side of the computer cabinet 100. Two frame beams 12 are positioned on the top end and bottom end of the right side of the computer cabinet 100. Two guide rails 41 are secured to the two frame beams 12, respectively. Sliders 421 and 423 are engaged with the top guide rail 41, while sliders 422 and 424 are engaged with the bottom guide rail 41. The support beam 1471 is coupled to the sliders 421 and 422, while the support beam 1472 is coupled to the sliders 423 and 424. During the assembly process, the support beams 1471 and 1472 carried by the sliders 421-424 can slide along the respective guide rails 41 and stop at any position within a range defined by the two opposing vertical frame beams 111 and 112, thereby enhancing assembly flexibility. The support beams 1471 and 1472 can be used for mounting fans, radiators, or other components or structures.

FIG. 14 shows further details about the third type of slidable mounting structure. The guide rail 41 can be coupled to the frame beam 12 using screw fasteners. The guide rail 41 partially encloses the sliders 421 and 423. Each slider 421 or 423 includes a threaded positioning hole 432. By screwing a fastener through the threaded positioning hole 432 during assembly, the opposing edges along the length of the slider 421 or 423 presses against the opposing edges of the guide rail 41, and the tip of the fastener pushes against the guide rail 41, thereby inhibiting movement of the slider 421 or 423. The slider 421 or 423 further includes threaded holes 431 and 433 for coupling with a support beam, such as the support beams 1471 or 1472, or for mounting another layer of slidable mounting structure as described below. In one example, the guide rail 41 is made of aluminum extrusion, and the sliders 421-424 are made of POM.

Figure 15:
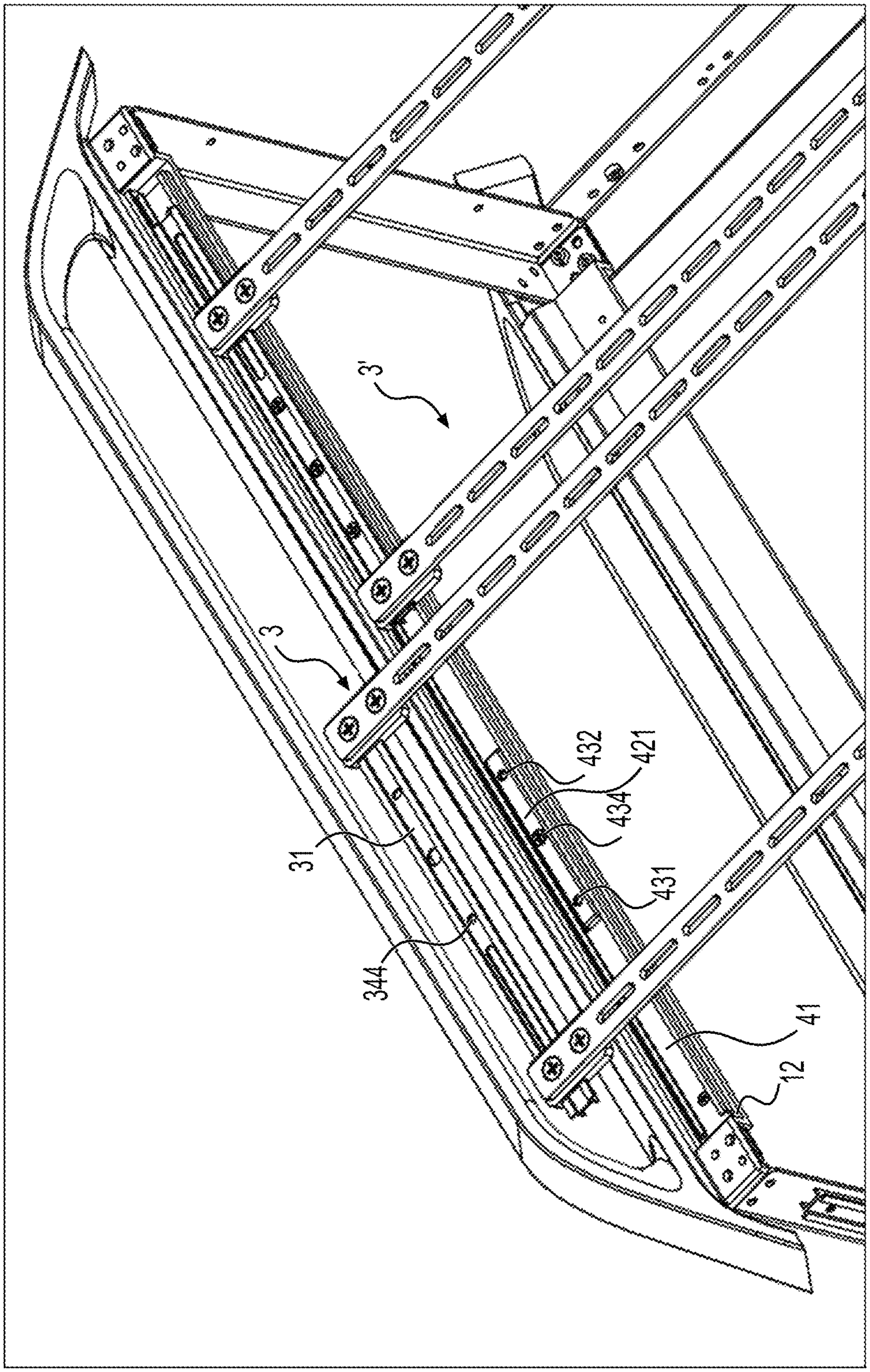
FIG. 15 shows a portion of the right side of the computer cabinet 100 where the frame beam 12, the guide rail 41, and the slider 421 are assembled together using a screw fastener 434.

FIGS. 15 and 16A-16D show a fourth type of slidable mounting structure that includes a first layer of slidable mounting structure stacked on a second layer of slidable mounting structure (dual-layer slidable mounting structure). FIG. 15 shows a portion of the right side of the computer cabinet 100 where the frame beam 12, the guide rail 41, and the slider 421 are assembled together using a screw fastener 434. The guide rail 41 and the slider 421 form the first layer of the slidable mounting structure (i.e., a base layer). An FR mounting assembly 3, as the second layer of the slidable mounting structure (an upper layer), is disposed on the base layer. By screwing fasteners through the through holes 344 and the respective threaded holes 431 and 432, the guide rail 31 of the upper layer is coupled to the slider 421 of the base layer. By loosening the screw fastener 434, the FR mounting assembly 3, as a whole and possibly with fans and radiators mounted, can slide along the guide rail 41, thereby enhancing the flexibility and the simplicity of assembly of the computer cabinet 100. In a similar manner, another FR mounting assembly 3' can be mounted over the base layer.

Figure 16A:
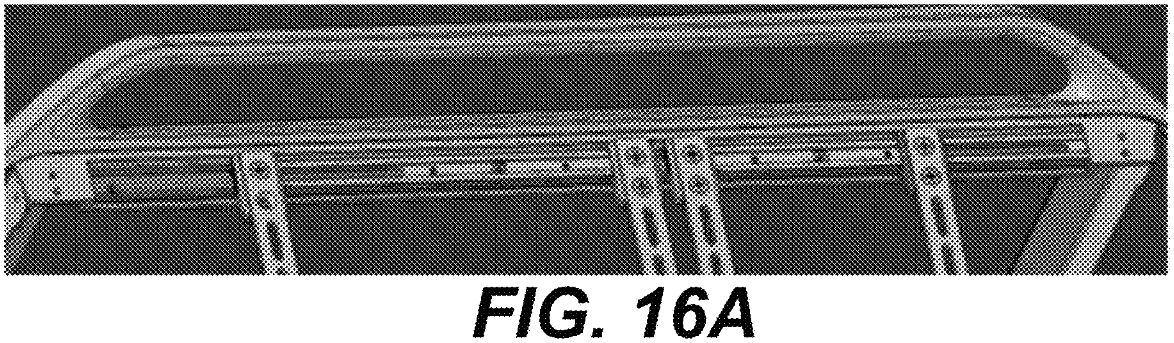
FIGS. 16A-16D show variants of FR mounting assemblies shown in FIG. 15, including different positions and sizes, when stacked slidable mounting structures are employed.
Figure 16B:
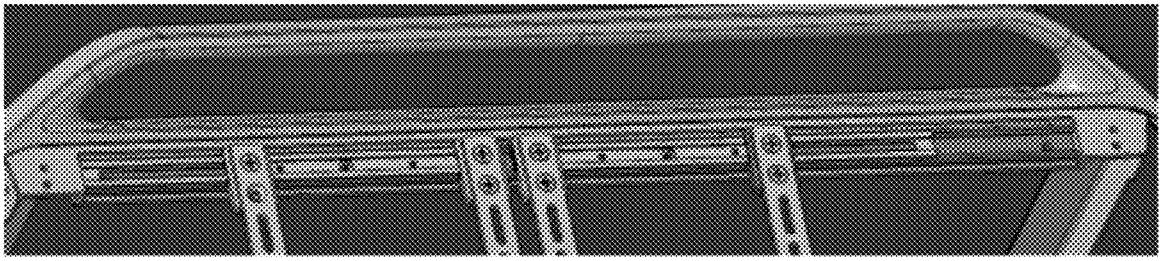
Figure 16C:
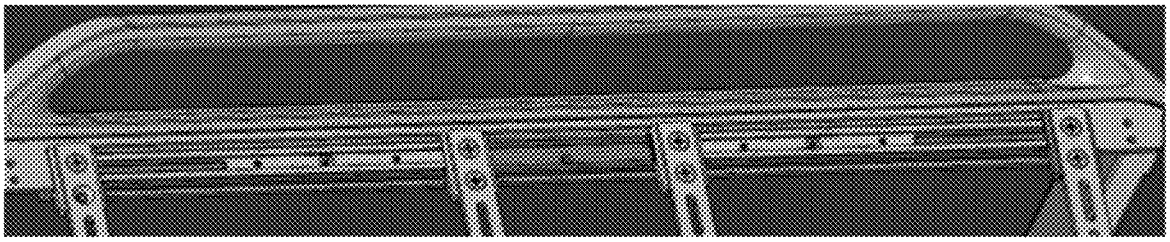
Figure 16D:
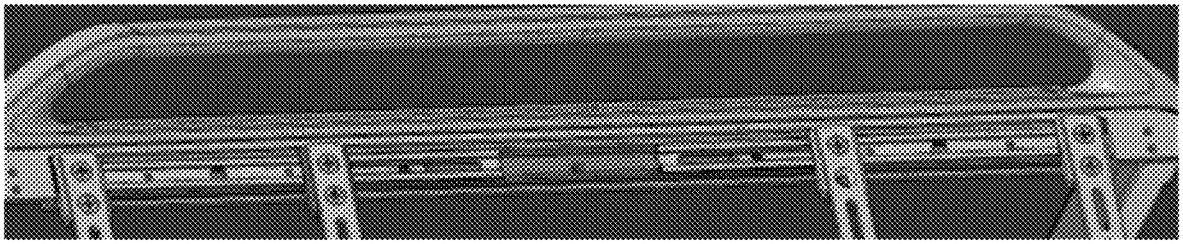

FIGS. 16A-16D show variants of FR mounting assemblies shown in FIG. 15, including different positions and sizes, when stacked slidable mounting structures are employed. In FIG. 16A, two upper layer guide rails are arranged close to right end of the base-layer guide rail. The two FR mounting assemblies have different support beam distances. In FIG. 16B, two upper layer guide rails are arranged close to the left end of the base-layer guide rail. The two FR mounting assemblies have the same minimum support beam distances. In FIG. 16C, two upper layer guide rails are arranged at both ends of the base-layer guide rail. The two FR mounting assemblies have the same maximum support beam distances. In FIG. 16D, the length direction of the upper-layer guide rails is reversed 180 degrees such that the positions of the respective slide slots are changed. It will be appreciated that, given the variants such as the positions and orientations of the upper guide rails, the spacing between support beams, and the number of upper-layer FR mounting assemblies, the dual-layer slidable mounting structure offers numerous assembly configurations, thereby providing a high degree of flexibility in component arrangement and assembly.

Figure 17A:
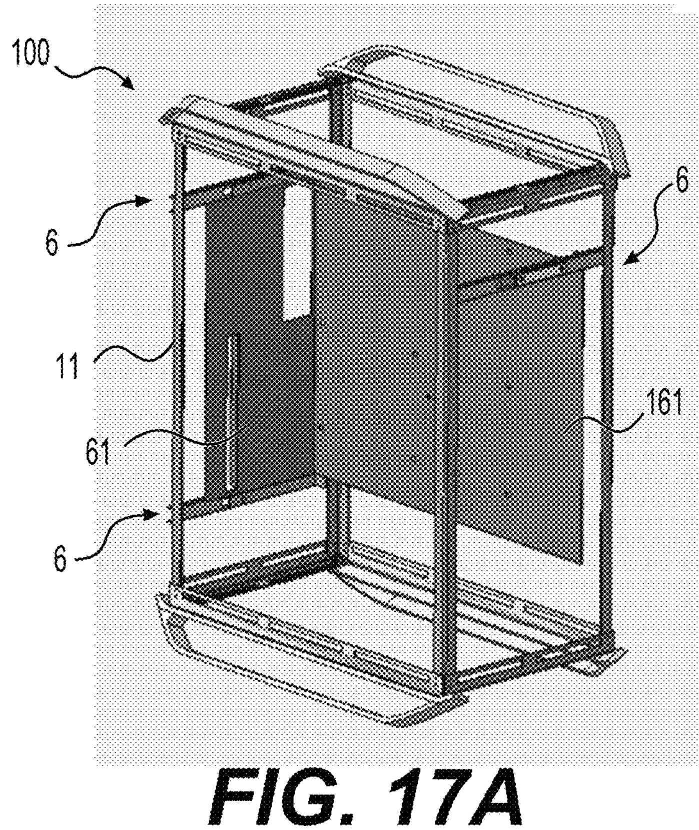
FIGS. 17A and 17B show a schematic view of a motherboard tray 161 and a backside panel 61 (interface panel) being installed at a first position.
Figure 17B:
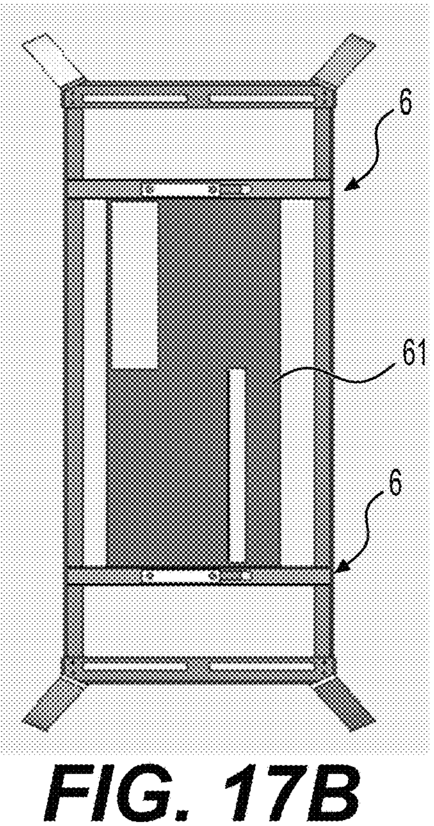

FIGS. 17A/17B/18A/18B/19 show a fifth type of slidable mounting structure, which is referred to as motherboard bracket assembly 6. FIGS. 17A and 17B show a schematic view of a motherboard tray 161 and a backside panel 61 (interface panel) being installed at a first position. In FIGS. 17A and 17B, two motherboard bracket assemblies 6 are mounted at the backside of the computer cabinet 100 between two vertical frame beams 11. The backside panel 61 is attached to the two motherboard bracket assemblies 6. A third motherboard bracket assembly 6 is mounted at the frontside of the computer cabinet 100. The motherboard tray 161 is coupled to motherboard bracket assemblies 6.

Figure 18A:
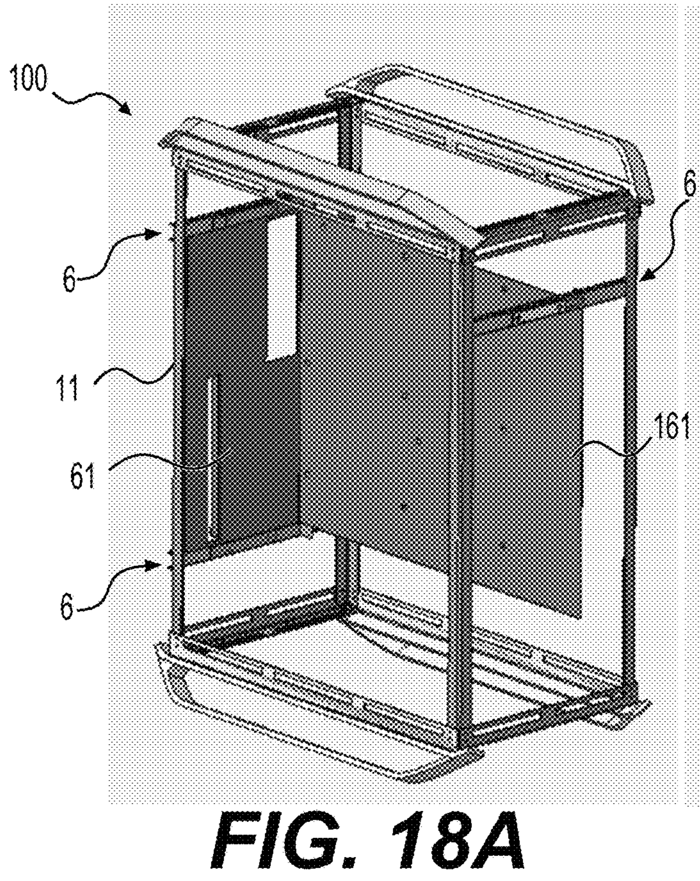
FIGS. 18A and 18B show a schematic view of a motherboard tray 161 and a backside panel 61 being installed at a second position.
Figure 18B:
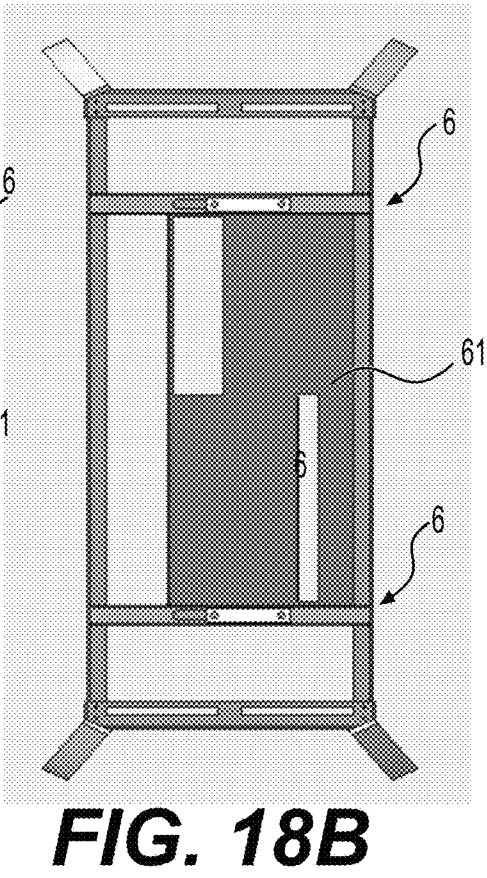
Figures 1, 17A:
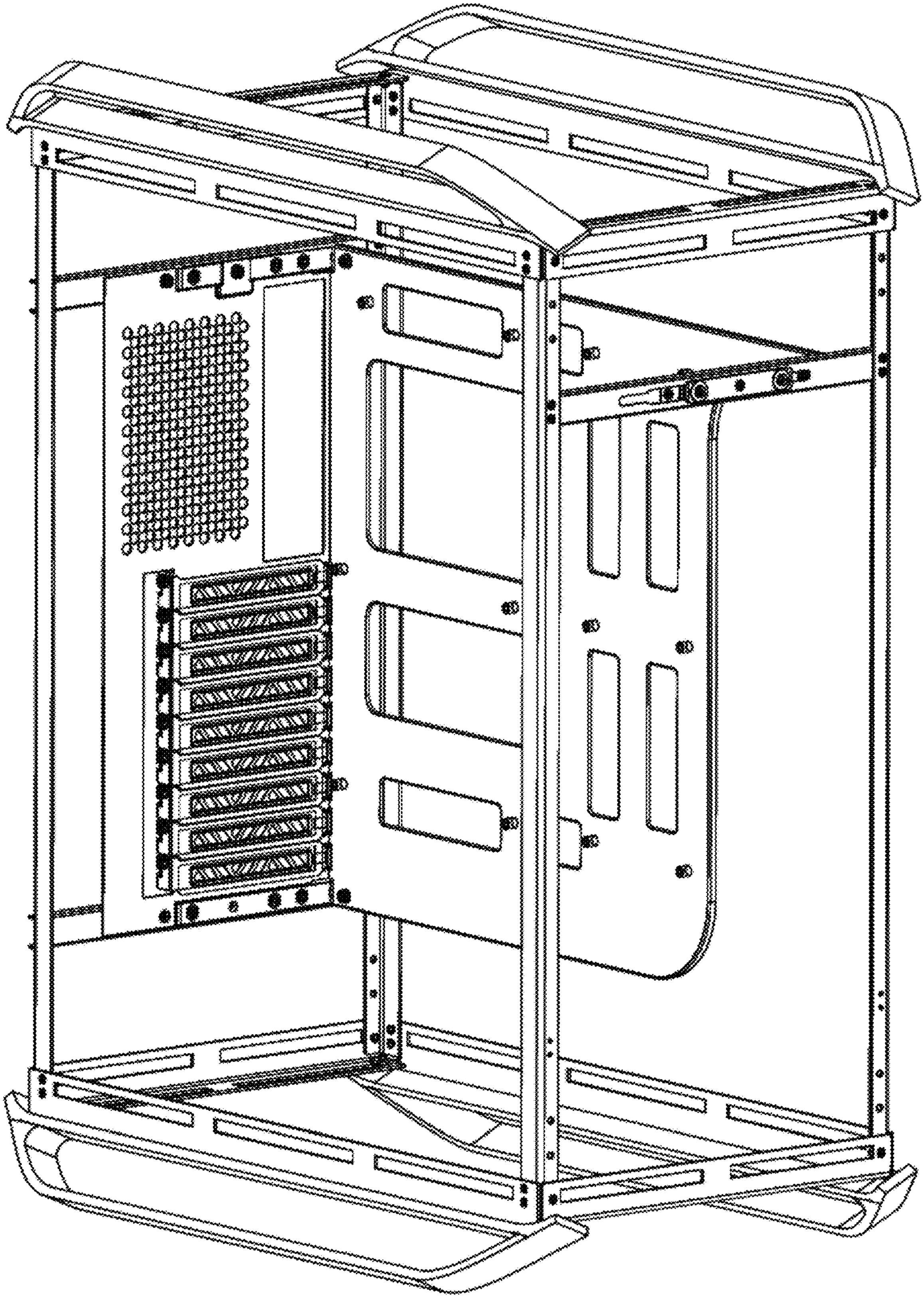
Figures 1, 17B:
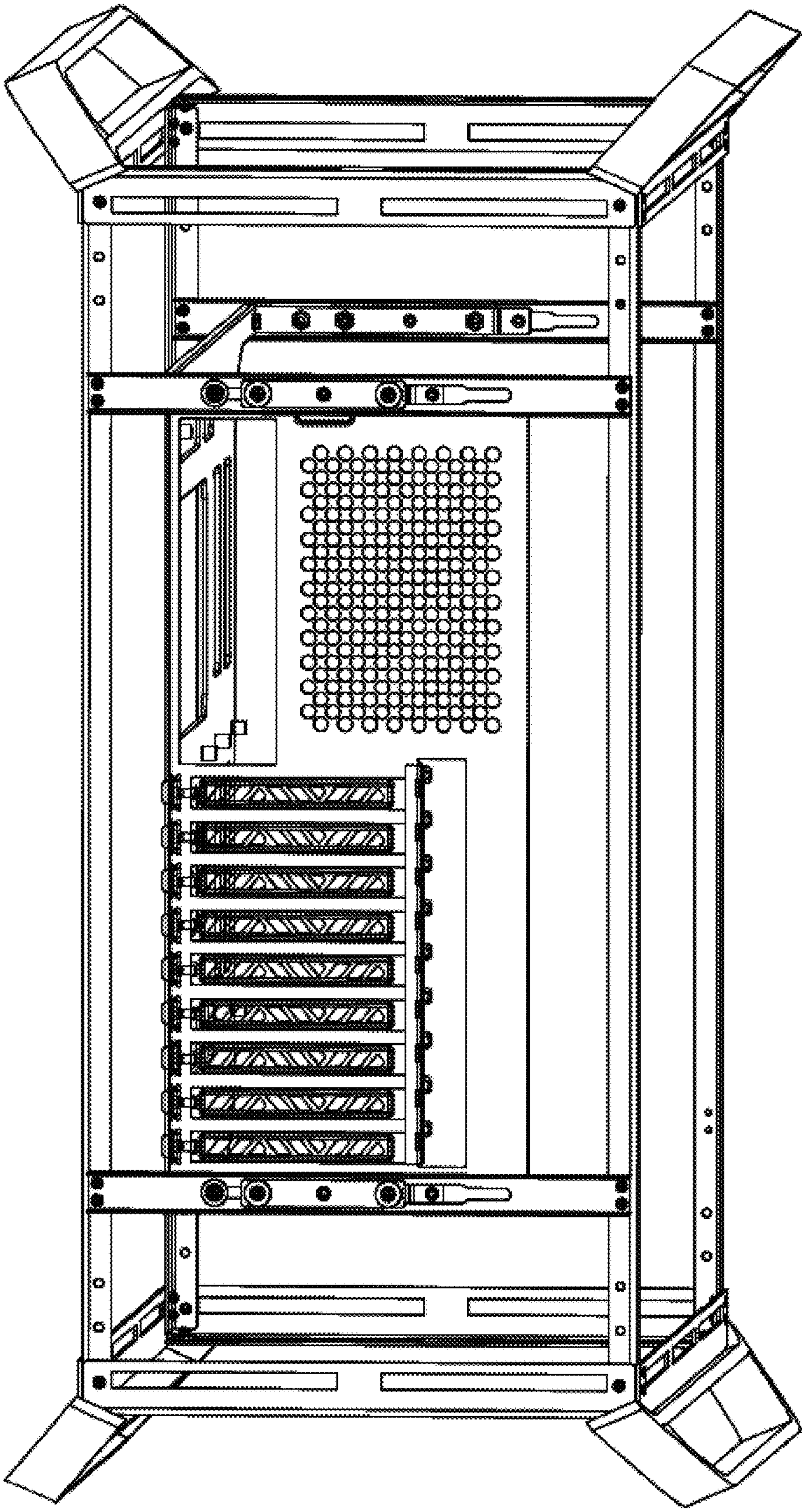
Figures 1, 18A:
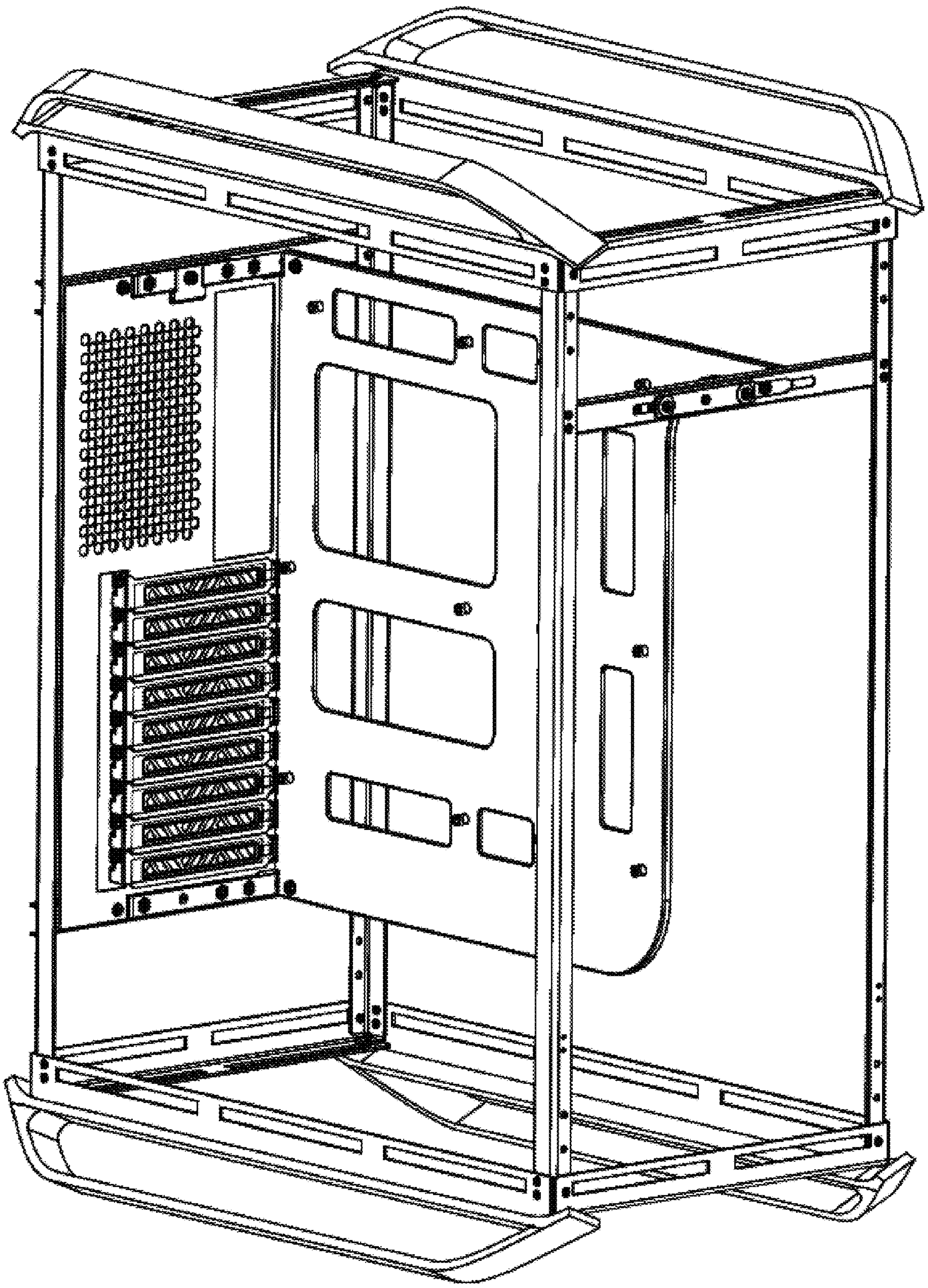
Figures 1, 18B:
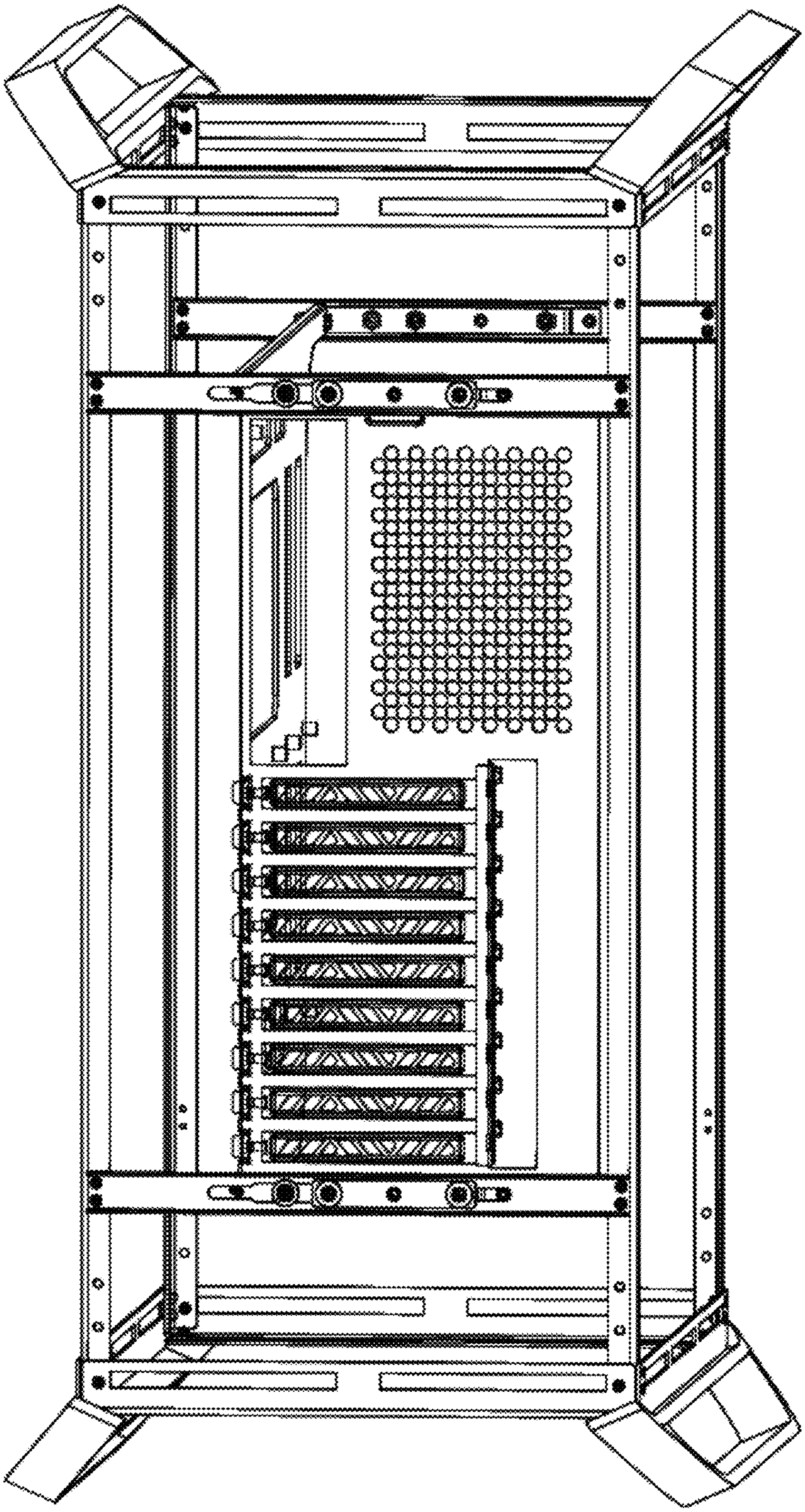

FIGS. 18A and 18B show a schematic view of a motherboard tray 161 and a backside panel 61 being installed at a second position. The second position is closer to the left side of the computer cabinet 100 than the first position. In FIGS. 18A and 18B, three motherboard bracket assemblies 6, the backside panel 61, and the motherboard tray 161 are similarly installed as in FIGS. 17A and 17B. FIGS. 17A-1, 17B-1, 18A-1, and 18B-1 show similar structures and components as FIGS. 17A, 17B, 18A, and 18B, but with different configurations of the backside panel 61 and the motherboard tray 161.

Figure 19:
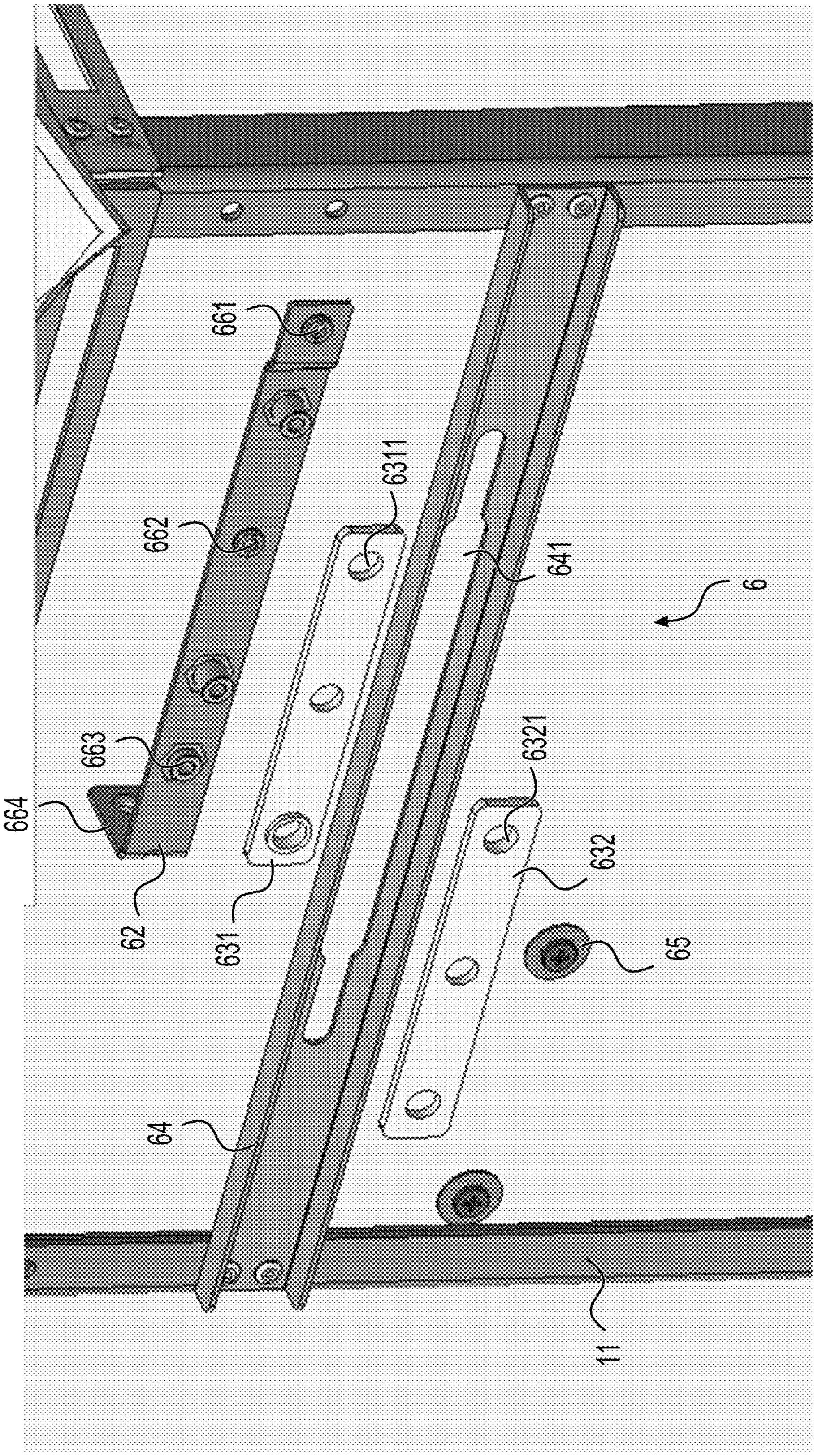
FIG. 19 shows further details about the motherboard bracket assembly 6.
Figures 1, 19:
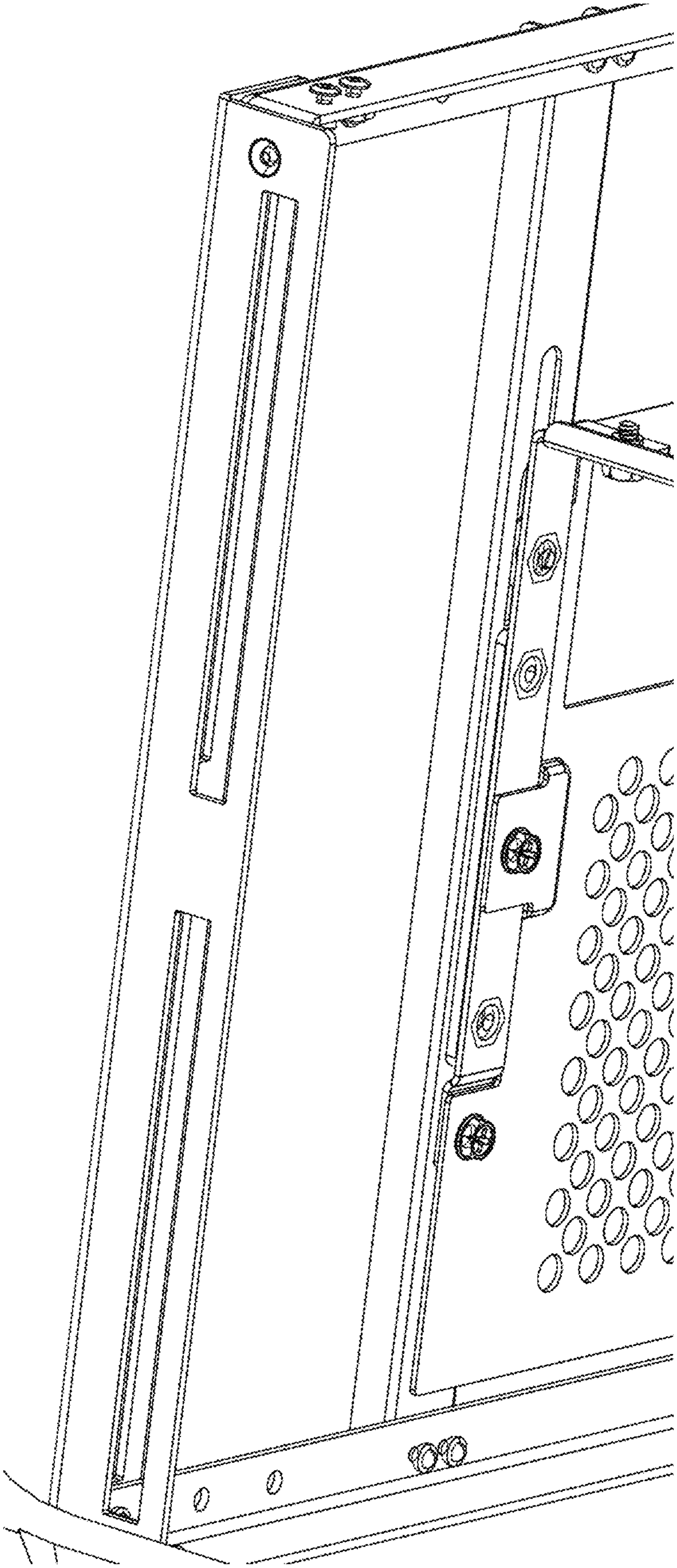
Figures 2, 19:
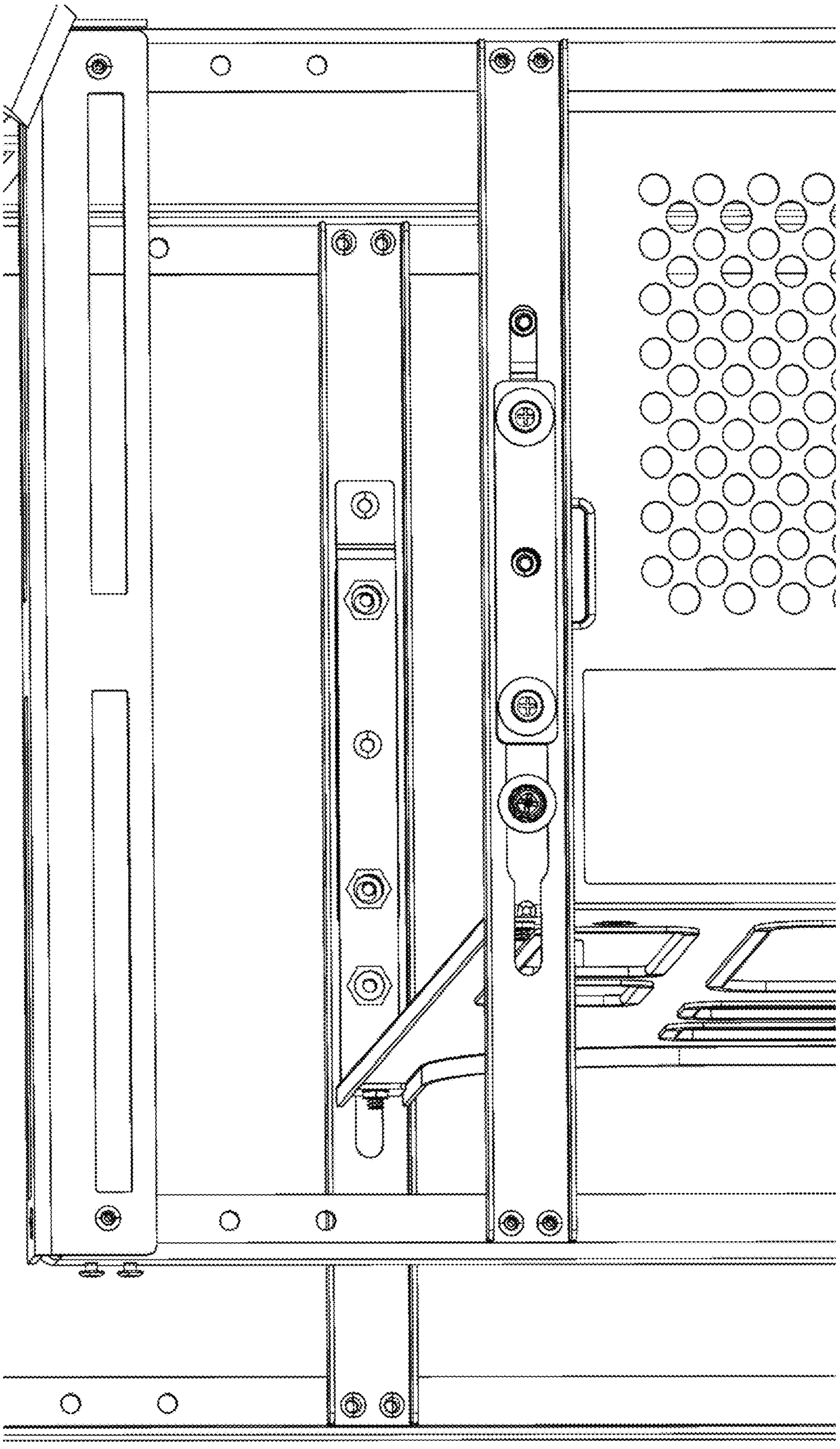

FIG. 19 shows further details about the motherboard bracket assembly 6. The motherboard bracket assembly 6 includes a support beam 64 coupled to two opposing frame beams 11. The support beam 64 includes an elongated slide slot 641 extending in the length direction of the support beam 64. The width of the slide slot 641 is narrower at two ends than at the middle. Two sliders 631 and 632 are configured at opposing sides of the support beam 64. The sliders 631 and 632 can be made of a material with high rigidness and low friction, such as POM. The motherboard bracket assembly 6 further includes a slide bracket 62 arranged at the inner side of the support beam 64. Screw fasteners 65 pass through respective through holes 6311 and 6321 of the sliders 632 and 631 and the slide slot 641 to engage with screw holes in the slide bracket 62, thereby fixing the sliders 631 and 632 onto the support beam 64. When the screw fasteners 65 are loosened during an assembly process, the slide bracket 62 and the sliders 631 and 632 together can slide along the slide slot 641. The slide bracket 62 can include other structures, such as through holes or threaded holes 661-663 and protrusion 664, for mounting the backside panel 61, the motherboard tray 161, motherboard, and the like. FIG. 19-1 and FIG. 19-2 show further details of the motherboard bracket assembly 6.

Figures 20A, 20B:
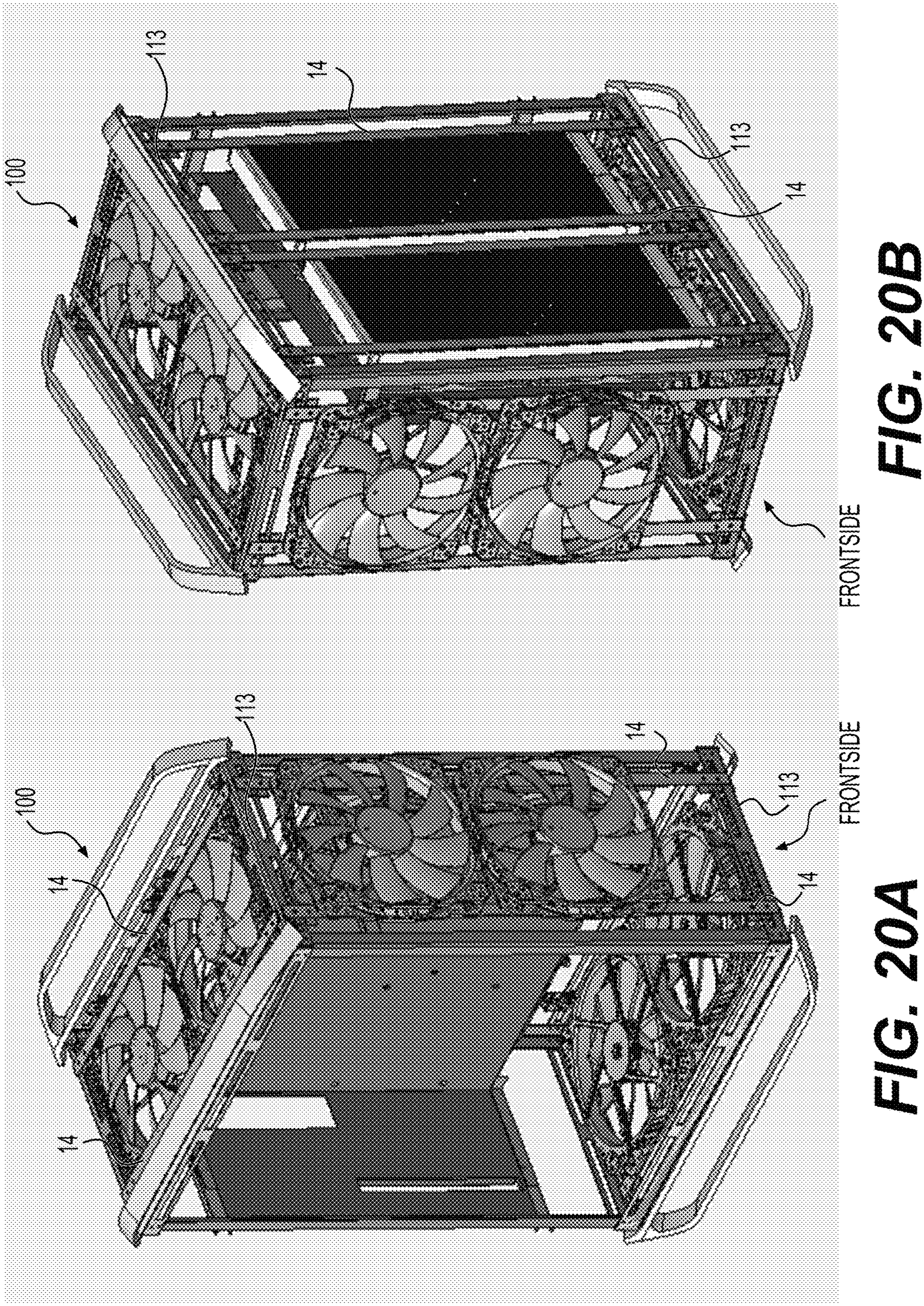
FIG. 20A and FIG. 20B show different perspective views of the computer cabinet 100.
Figures 1, 20A:
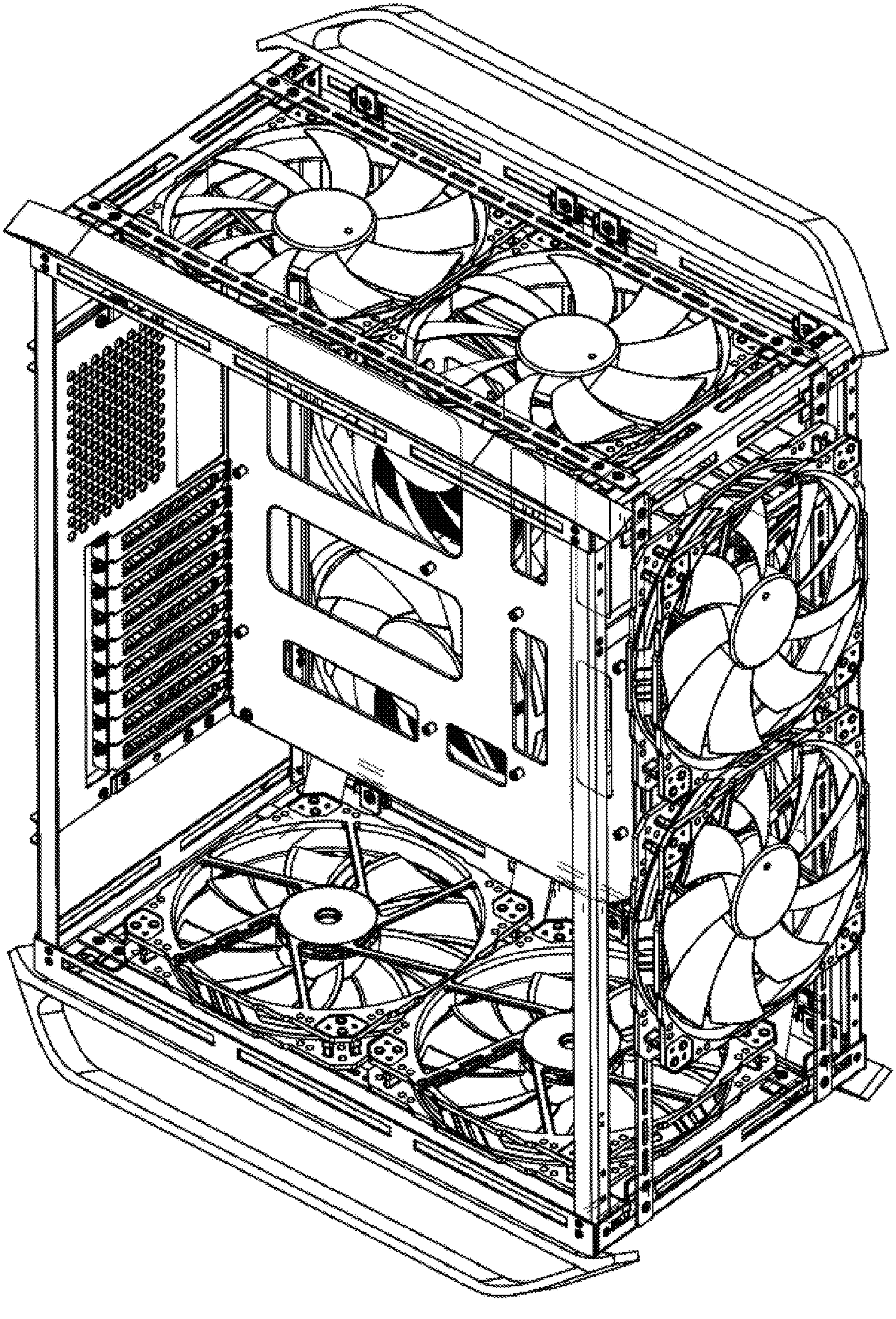
Figures 1, 20B:
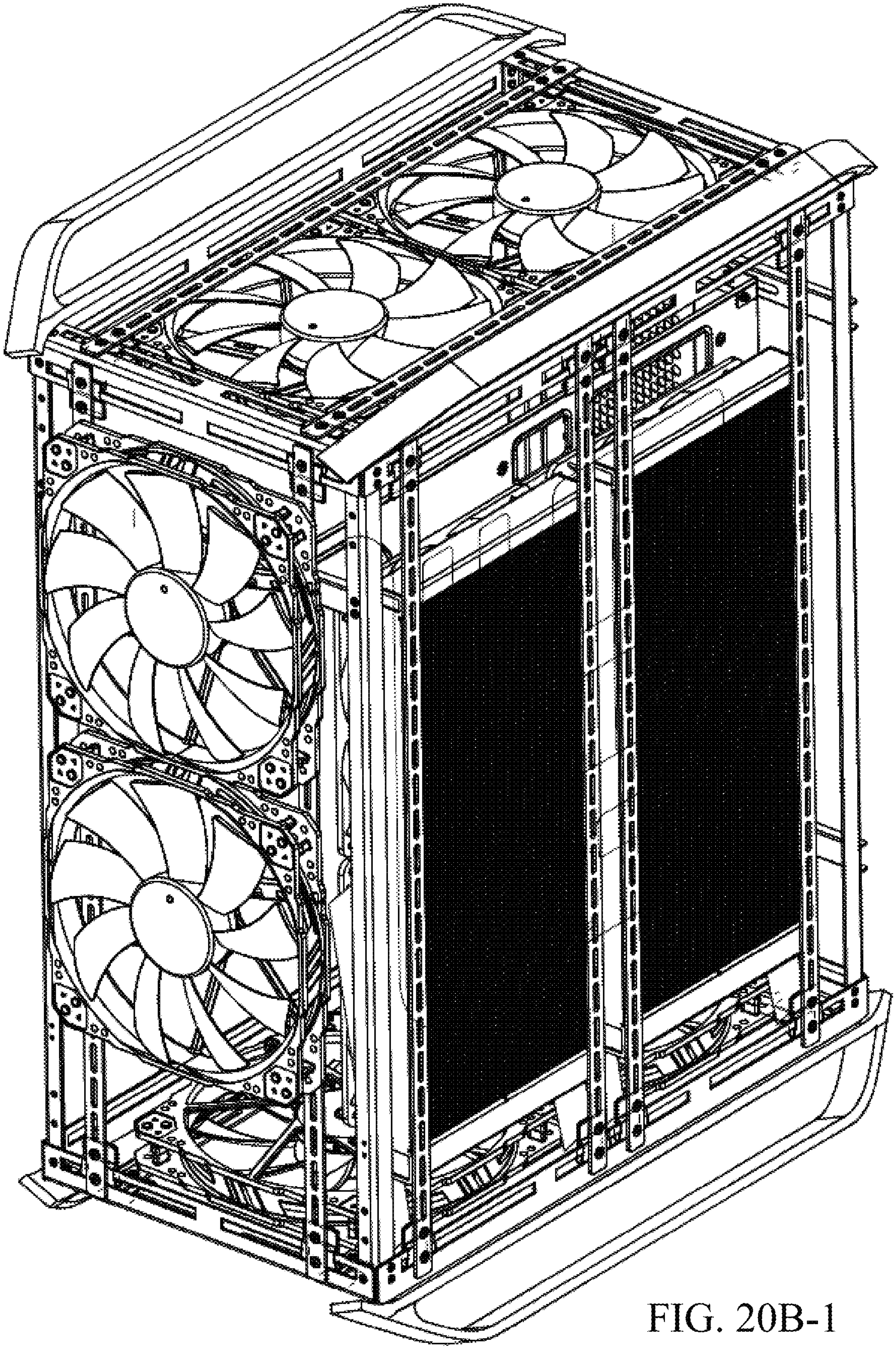

FIGS. 20A/20B/21/22/23 show a sixth type of slidable mounting structure. FIG. 20A and FIG. 20B show different perspective views of the computer cabinet 100. The computer cabinet 100 includes twelve frame beams 113 forming a main frame of the computer cabinet 100. Support beams 14 are attached to opposing frame beams 113 at topside, bottom side, backside, frontside, and right side of the computer cabinet 100. The sixth type of slidable mounting structure is employed for assembling the support beams 14 and the frame beams 113. FIGS. 20A-1 and 20B-1 show similar structures and components as FIGS. 20A-1 and 20B-1, however, with different configurations of the backside panel 61 and motherboard tray 161.

Figure 21:
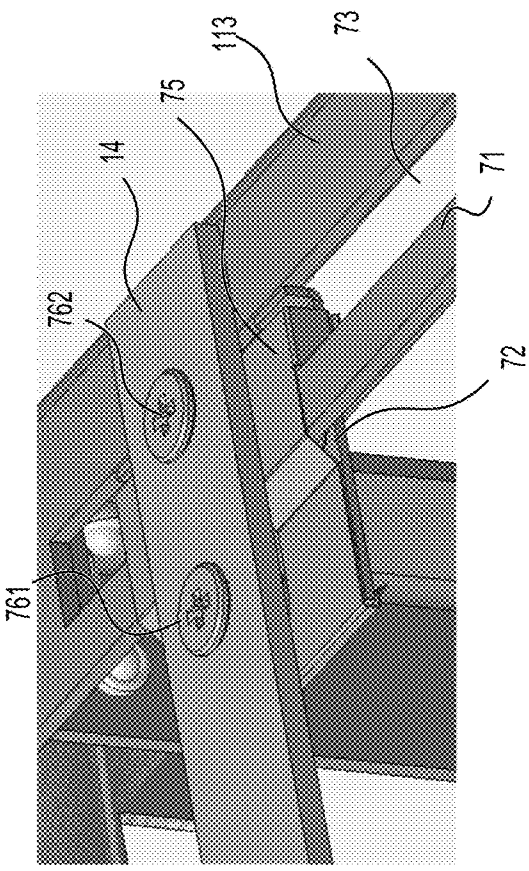
FIGS. 21-23 show different views of the sixth type of slidable mounting structure.
Figure 22:
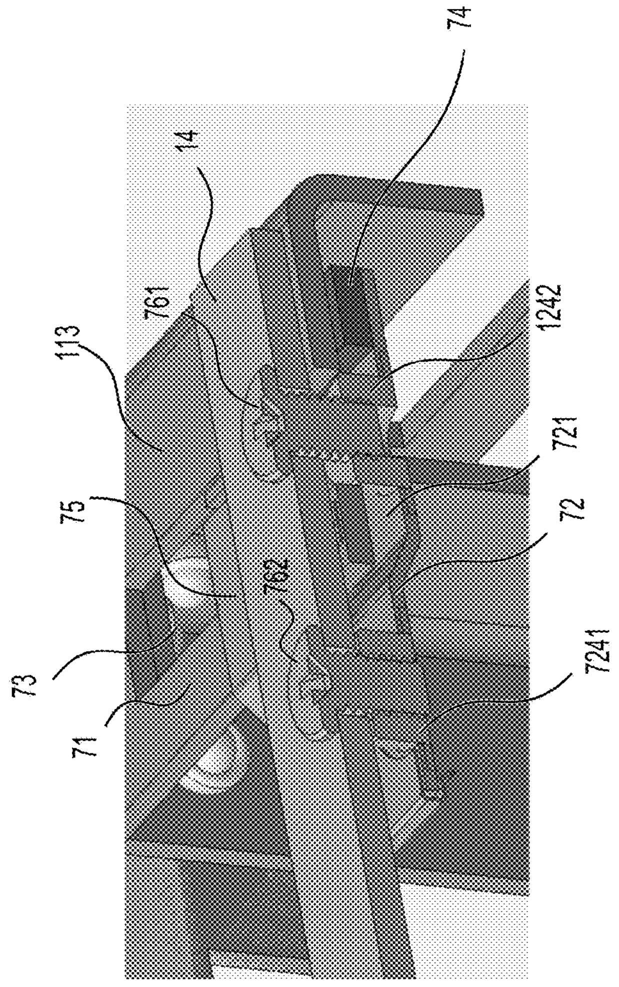
Figure 23:
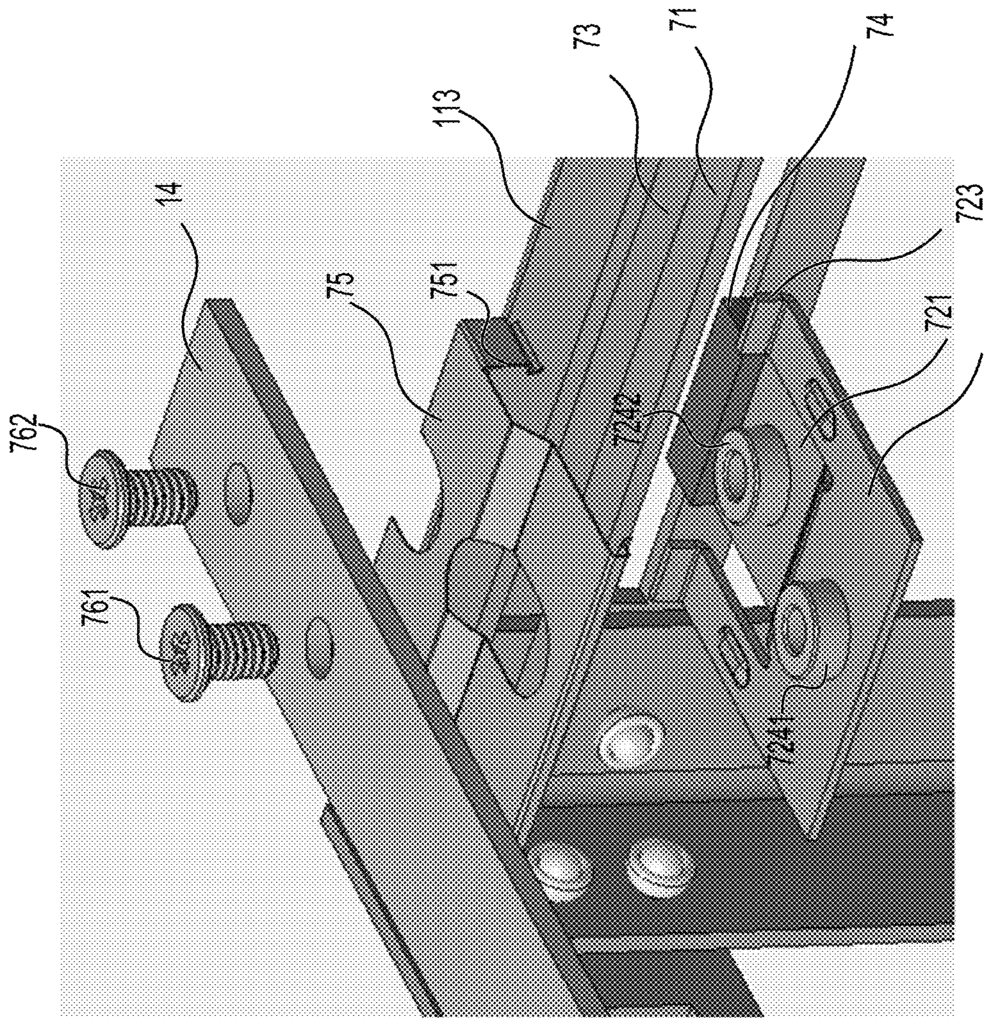

FIGS. 21-23 show different views of the sixth type of slidable mounting structure. FIG. 21 shows a perspective view. FIG. 22 shows a cross-sectional view. FIG. 23 shows an exploded view. As shown, the frame beam 113 (guiding frame beam) has an elongated slide slot 73 on its flange. The slide slot 73 is adjacent to a guide rail 71 that is part of the flange of the frame beam 113. A slider 72 is arranged below the guide rail 71. The slider 72 includes two threaded nuts 7241 and 7242 thereon. The slider 72 further includes a tongue structure 721 with a rubber pad 74 arranged at an edge of the tongue structure 721. The slider 72 further includes protrusions 723 formed at an edge of the slider 72 and extending upward. A slider holder 75 is positioned above the guide rail 71 and opposite the slider 72. The slider holder 75 includes a protrusion with an edge 751.

By fastening a screw fastener 761, through the support beam 14 and the slider holder 75, into the threaded nut 7241, the support beam 14, the slider holder 75, and the slider 72 are coupled together, with the guide rail 71 between the slider holder 75 and the slider 72. The slider 72 together with the slider holder 75 and the support beam 14 can slide along the guide rail 71 with the protrusion 723 and the edge 751 respectively touching each of opposing inner surfaces of the slide slot 73, increasing stability of the sliding movement.

By fastening a screw fastener 762, through the support beam 14 and the slider holder 75, into the threaded nut 7242, the rubber pad 74 is pushed upward against the bottom surface of the flange of the frame beam 113, thereby inhibiting the movement of the slider 72, the slider holder 75, and the support beam 14. During an assembly process, the screw fastener 762 can be loosened to make the support beam 14 slidable.

Figure 24:
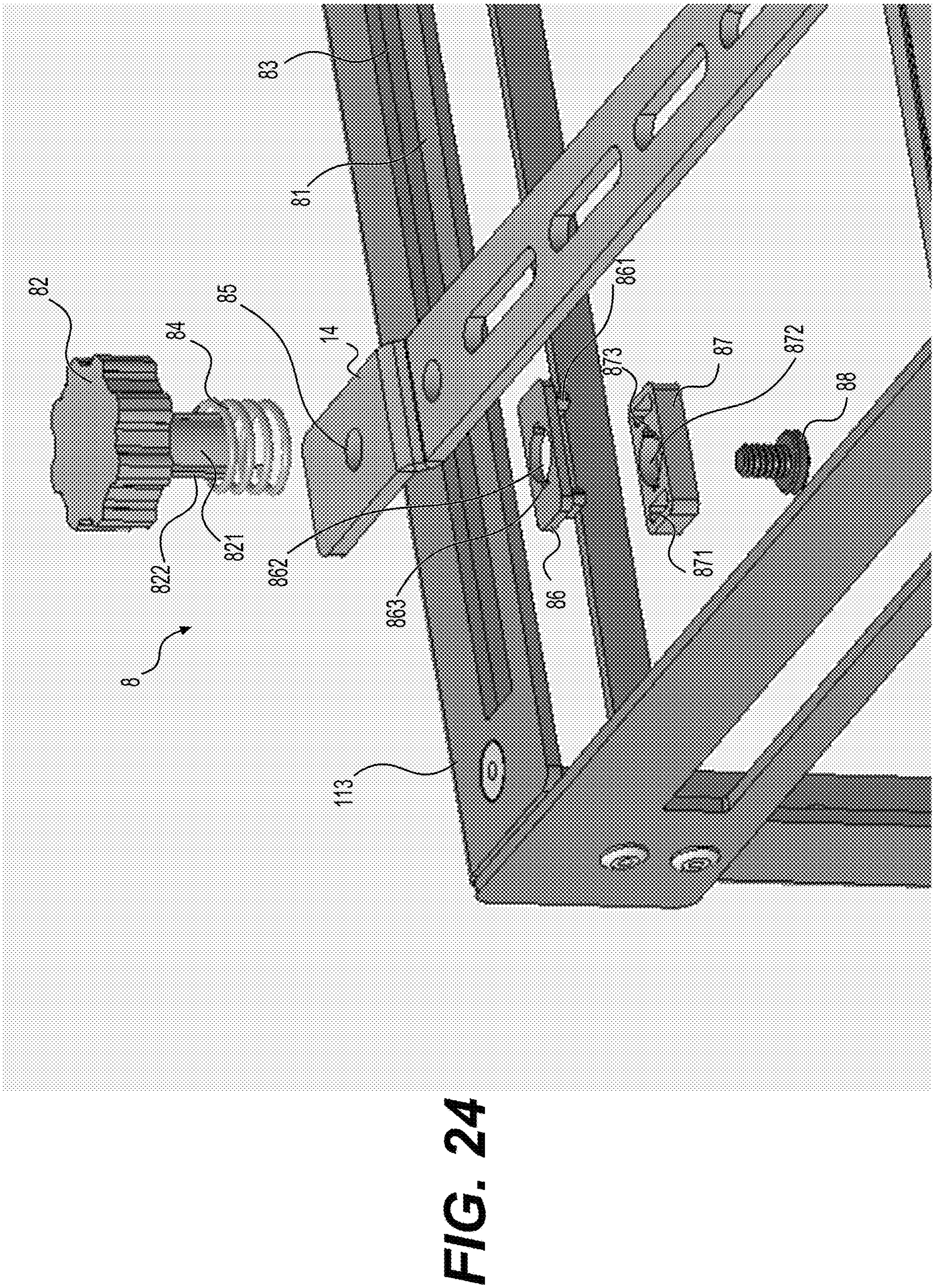
FIG. 24 shows a portion of a main frame similar to the main frame shown in FIG. 20A.
Figure 25:
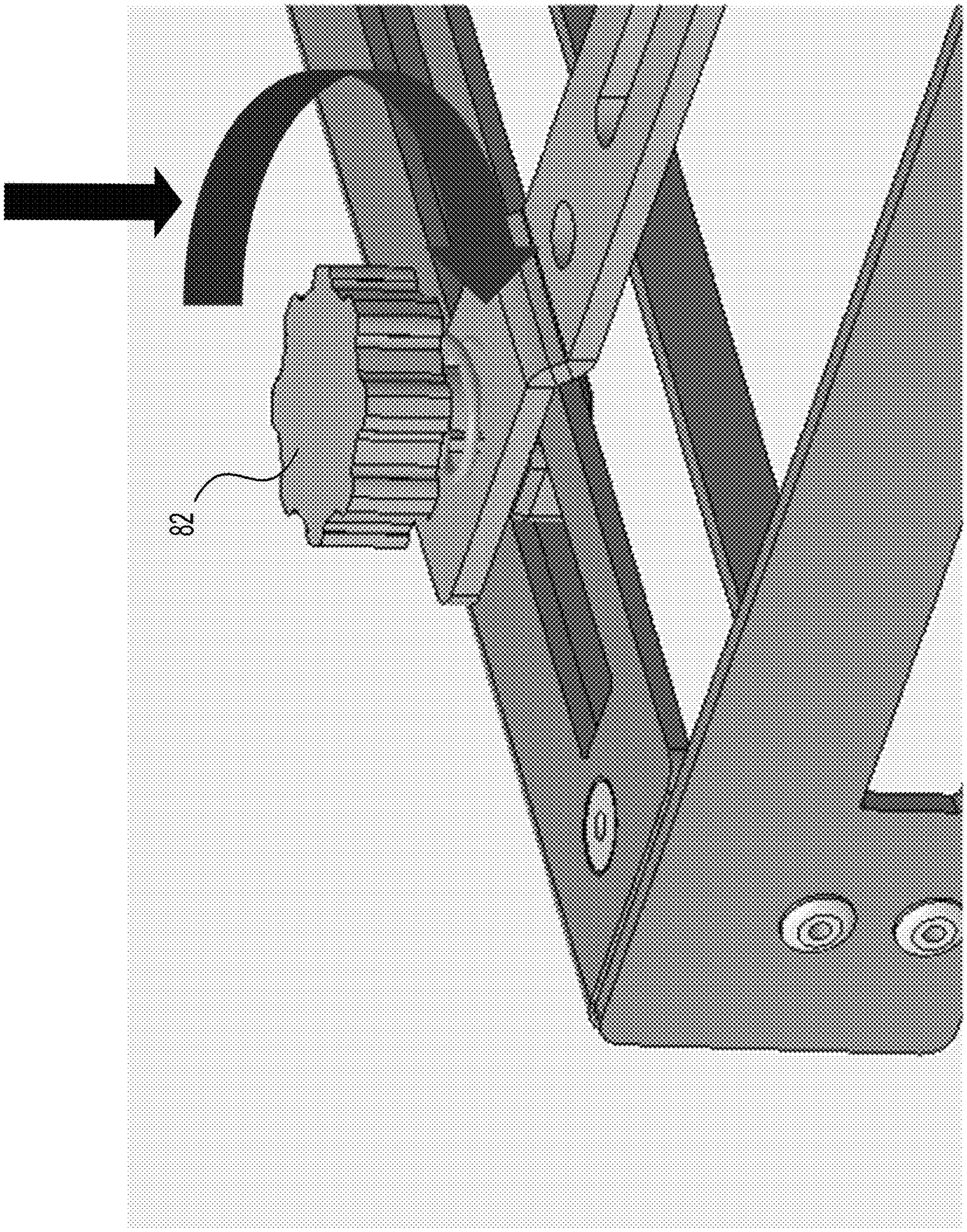
FIG. 25 shows the assembled knob assembly 8 after the fastener 88 is tightly screwed into an opening within the lever arm 821.

FIGS. 24-25 show a seventh type of slidable mounting structure. FIG. 24 shows a portion of a main frame similar to the main frame shown in FIG. 20A. The main frame includes a frame beam 113 (guiding frame beam) having a flange including a slide slot 83 and a guide rail 81. A quick-release knob assembly 8 is employed to affix a support beam 14 to the frame beam 113. The knob assembly 8 includes a knob 82, a spring 84, a rubber pad 86, a base 87, and a fastener 88. During an assembly process, a lever arm 821 of the knob 82 passes successively through the spring 84, the through hole 85 of the support beam 14, the slide slot 83, and the through holes 862 and 872 of the rubber pad 86 and the base 87, respectively, to engage with the fastener 88.

The rubber pad 86 includes one or more protrusions 861 extending downward. The protrusions 861 are received into respective openings 871 in the base 87. In addition, the lever arm 821 has one or more guiding protrusions 822 that extend outward from a surface of the lever arm 821 and along an axial direction of the lever arm 821. The guiding protrusions 822 match with recesses 863 and 873 on sidewalls of the openings 862 and 872, respectively. Due to the guiding protrusions 822 with the corresponding recesses 863 and 873 and the protrusions 861 with the corresponding openings 871, the rubber pad 86 and the base 87 rotate along with the knob 82 when the knob 82 is in rotation movement.

FIG. 25 shows the assembled knob assembly 8 after the fastener 88 is tightly screwed into an opening within the lever arm 821. At the current state, the lengths of the rubber pad 86 and the base 87 align to the length of the slide slot 83, and the support beam 14 together with the knob assembly 8 can slide along the slide slot 83, enabling positioning adjustment of the support beam 14.

Figure 26:
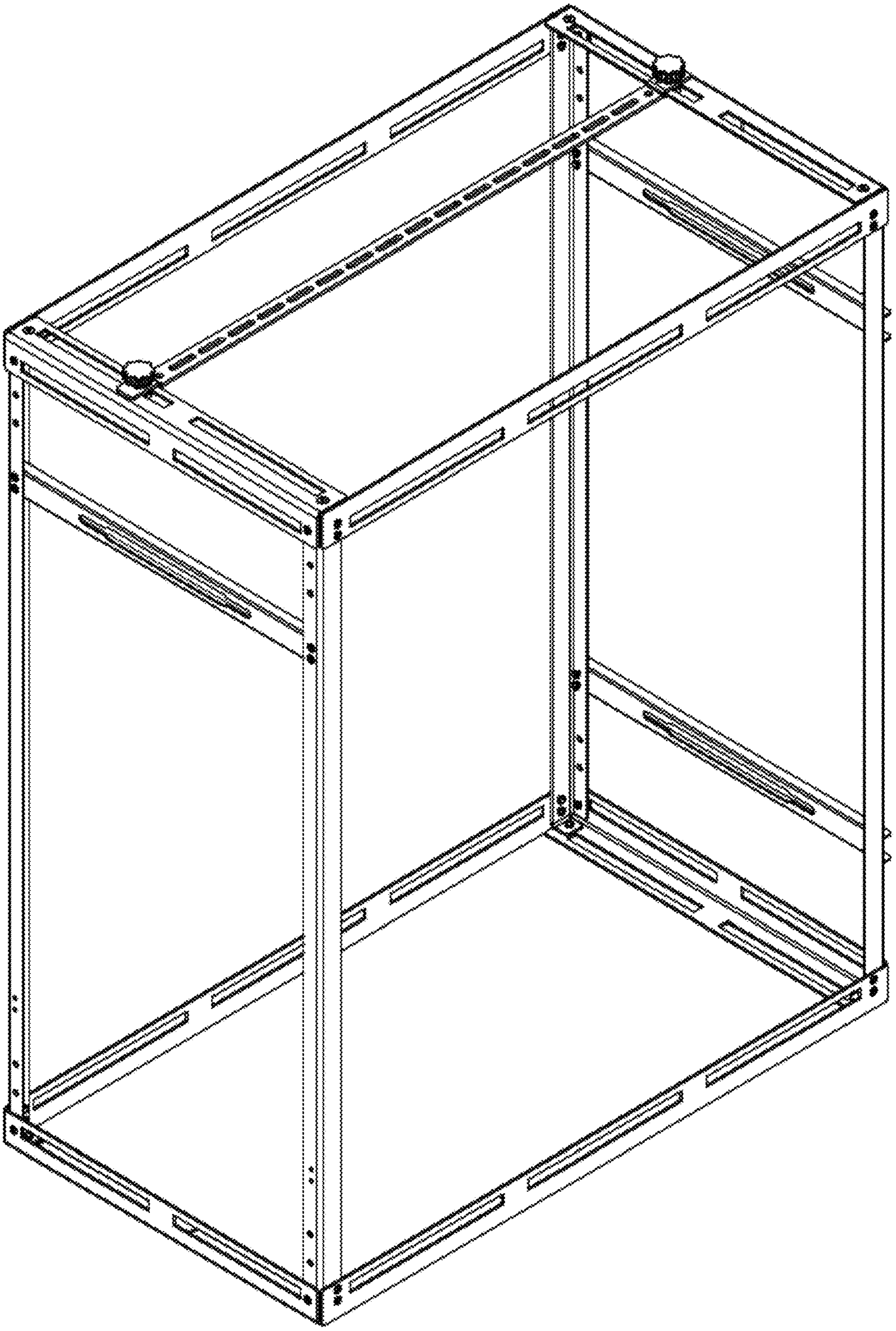
FIG. 26 shows the knob assembly 8 is employed in coupling a support beam 14 to a main frame 1.

When a user pushes the knob 82 downward followed by rotating the knob 82, the knob assembly can turn into a locking state, affixing the support beam 14 to the frame beam 113. Specifically, when the knob is pushed down, the top surface of the rubber pad 86 would first be lowered to be below the bottom surface of the guide rail 81 (and the respective flange of the frame beam), allowing the rotation of the rubber pad 86 and the base 87. When the knob 82 is further rotated, the lengths of the rubber pad 86 and the base 87 can become aligned with the length of the support beam 14. When the user releases the knob 82, the spring 84 exerts a press force to push back the knob 82, clamping the rubber pad 86 towards the bottom surface of the flange of the frame beam 113. FIG. 26 shows the knob assembly 8 is employed in coupling a support beam 14 to a main frame 1.

The knob 82 may be formed from a variety of suitable materials, including metals such as aluminum or stainless steel, or plastics such as ABS or nylon, depending on design preferences, strength requirements, and manufacturing considerations. The rubber pad 86 may be composed of a high-friction, elastic material such as natural rubber or a synthetic rubber compound. This rubber pad is intended to provide enhanced grip and frictional engagement with the underlying surface, thereby enhancing the locking stability when the knob is rotated into a locking position. The elasticity of the rubber material also helps absorb minor dimensional variations, allowing a more secure and vibration-resistant locking performance.

The various structures or elements described in this disclosure, such as frame beams, support beams, guide rails, and similar components, are preferably fabricated from metal materials such as steel, aluminum, or other suitable alloys, in order to ensure sufficient mechanical strength, structural rigidity, and durability during assembly and use. In alternative embodiments, depending on the specific performance requirements, weight considerations, or cost constraints, these structural elements may also be made from high-strength plastic materials or composite materials that offer adequate mechanical performance. Furthermore, the sliders disclosed in this disclosure can be made of low-friction, wear-resistant materials such as polyoxymethylene (POM), which provides smooth sliding movement, dimensional stability, and excellent resistance to abrasion over prolonged periods of use.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A computer cabinet, comprising:
a main frame including a plurality of frame beams;
a mounting platform configured to support electronic components;
a plurality of first guide rails mounted to the frame beams;
a plurality of first sliders, each first slider slidably coupled to a corresponding first guide rail of the plurality of first guide rails; and
a manual cam lock including a lever connected to an eccentric cam coupled to an axis of rotation,
wherein each first slider includes a slider body defining a receiving channel, each first guide rail includes a longitudinal guide portion received in the receiving channel of the corresponding one of the first sliders, such that each first slider is retained on and guided for sliding movement along the corresponding first guide rail,
the mounting platform is coupled to the plurality of first sliders such that the mounting platform is slidable along the plurality of first guide rails,
the manual cam lock is connected to one of the plurality of first sliders and moves together with the one of the plurality of first sliders along the corresponding first guide rail, and
upon pushing the lever down, the eccentric cam rotates and presses against the corresponding first guide rail, thereby creating a clamping pressure between the first sider and the corresponding first guide rail to inhibit motion of the first slider along the corresponding first guide rail.

2. The computer cabinet of claim 1, wherein the plurality of first guide rails comprises four first guide rails mounted to the frame beams at a frontside and a backside of the computer cabinet, and
the plurality of first sliders comprises four first sliders, each slidably coupled to a corresponding one of the four first guide rails,
wherein the mounting platform comprises a rectangular frame including a frontside beam, a backside beam, an upper beam, a bottom beam, and a middle beam.

3. The computer cabinet of claim 1, further comprising:
a cover bracket attached to the frame beams on a side opposite to at least one first guide rail of the plurality of first guide rails,
wherein the cover bracket aligns with the first guide rail and is configured to conceal the at least one first guide rail and a corresponding first slider of the plurality of first sliders.

4. The computer cabinet of claim 1, further comprising:
a fan and radiator mounting assembly including:
a pair of second guide rails, each second guide rail mounted to opposing frame beams and having an elongated slide slot disposed on a portion thereof;
a pair of support beams configured to support fan and radiator components;
a plurality of second sliders, each second slider engaged with a corresponding second guide rail of the pair of second guide rails;
wherein the pair of support beams are coupled to the plurality of second sliders such that the support beams are configured to slide along the corresponding second guide rail, and
a distance between the pair of support beams is adjustable by sliding at least one of the support beams along the elongated slide slot.

5. The computer cabinet of claim 4, wherein each second slider includes a threaded hole and a through hole;
each support beam includes a first through hole and a second through hole at one end thereof,
a first screw fastener passes through the first through hole of the support beam and threadedly engages with the threaded hole of the corresponding second slider to couple the support beam to the second slider; and
a second screw fastener passes through the second through hole of the support beam, through the through hole of the second slider, and through the elongated slide slot, and engages with a positioning block;
wherein upon tightening the second screw fastener, the support beam and the second slider are secured to the second guide rail rendering them immobile, and upon loosening the second screw fastener, the support beam and the second slider can slide along the second guide rail.

6. The computer cabinet of claim 4, wherein at least one of the second guide rails includes elongated slide slots on opposing sides, thereby enabling both support beams to slide along respective slide slots.

7. The computer cabinet of claim 1, further comprising:
a pair of opposing frame beams;
a pair of third guide rails coupled to the pair of opposing frame beams, respectively;
a plurality of third sliders, each third slider engaged with a corresponding third guide rail of the plurality of third guide rails, each third slider including a threaded positioning hole; and
at least one support beam coupled to at least two third sliders engaged with different third guide rails,
wherein the support beam is configured to slide along the plurality of third guide rails.

8. The computer cabinet of claim 7, further comprising:
a plurality of positioning fasteners, each positioning fastener configured to be threaded through a corresponding threaded positioning hole of one of the third sliders, wherein upon tightening a positioning fastener through the threaded positioning hole, opposing edges along a length of the third slider press against opposing edges of the corresponding third guide rail, and a tip of the positioning fastener pushes against the corresponding third guide rail, thereby inhibiting movement of the third slider along the corresponding third guide rail.

9. The computer cabinet of claim 1, further comprising:

a dual-layer slidable mounting structure including:

a base layer comprising a base layer guide rail coupled to a frame beam of the plurality of frame beams, and a base layer slider slidably engaged with the base layer guide rail, the base layer slider including threaded holes; and an upper layer disposed on the base layer, the upper layer comprising an upper layer guide rail coupled to the base layer slider through the threaded holes, and an upper layer support structure mounted to the upper layer guide rail, wherein loosening a fastener coupling the base layer slider to the base layer guide rail allows the entire upper layer to slide along the base layer guide rail.

10. The computer cabinet of claim 9, wherein the upper layer guide rail includes an elongated slide slot disposed on a portion thereof, and the upper layer support structure comprises a fan and radiator mounting assembly including at least one support beam configured to support fan and radiator components, and at least one upper layer slider engaged with the upper layer guide rail, wherein the support beam is coupled to the at least one upper layer slider such that the at least one support beam is configured to slide along the elongated slide slot of the upper layer guide rail for adjustable positioning of fan and radiator components.

11. The computer cabinet of claim 1, further comprising:

a plurality of motherboard bracket assemblies, each motherboard bracket assembly including:

a support beam coupled to two opposing frame beams of the plurality of frame beams, the support beam having an elongated slide slot extending in a length direction of the support beam, a width of the slide slot being narrower at two ends than at a middle portion;

two fourth sliders configured at opposing sides of the support beam;

a slide bracket arranged at an inner side of the support beam; and fasteners passing through the fourth sliders and the slide slot to engage with the slide bracket;

wherein loosening the fasteners allows the slide bracket and the fourth sliders to slide along the slide slot for adjustable positioning.

12. The computer cabinet of claim 11, further comprising:

a motherboard tray coupled to the plurality of motherboard bracket assemblies; and a backside panel coupled to at least two motherboard bracket assemblies of the plurality of motherboard bracket assemblies, wherein the slide bracket includes threaded holes and protrusions configured for mounting the motherboard tray and the backside panel, and the motherboard tray and the backside panel are repositionable by sliding the slide brackets along the slide slots of the respective motherboard bracket assemblies.

13. The computer cabinet of claim 1, further comprising:

a plurality of guiding frame beams, each guiding frame beam having a flange with an elongated slide slot adjacent to a guide rail formed as part of the flange;

a plurality of support beams; and for each support beam:

a fifth slider arranged below the guide rail of a corresponding guiding frame beam, the fifth slider including a first threaded nut, a second threaded nut, a tongue structure with a rubber pad arranged at an edge of the tongue structure, and protrusions formed at an edge of the fifth slider extending upward;

a slider holder positioned above the guide rail and opposing the fifth slider, the slider holder including a protrusion with an edge; and a first fastener passing through the support beam and the slider holder and engaging with the first threaded nut to couple the support beam, slider holder, and fifth slider together with the guide rail positioned between the slider holder and the fifth slider.

14. The computer cabinet of claim 13, further comprising:

for each support beam, a second fastener passing through the support beam and the slider holder and engaging with the second threaded nut, wherein upon tightening the second fastener, the rubber pad is pushed upward against a surface of the flange of the corresponding frame beam, thereby inhibiting movement of the fifth slider along the guide rail, and upon loosening the second fastener, the fifth slider, slider holder, and the support beam can slide along the guide rail with the protrusions of the fifth slider and the edge of the slider holder respectively touching opposing inner surfaces of the slide slot for enhanced stability.

15. The computer cabinet of claim 1, further comprising:

a plurality of guiding frame beams, each guiding frame beam having a flange including a slide slot and a guide rail;

a plurality of support beams; and for each support beam, a knob assembly configured to affix the support beam to a corresponding guiding frame beam, the knob assembly including:

a knob having a lever arm with one or more guiding protrusions extending outward along an axial direction of the lever arm, a spring, a rubber pad having one or more protrusions extending downward and a through hole with recesses on sidewalls that match with the guiding protrusions, a base having openings that receive the protrusions of the rubber pad and a through hole with recesses on sidewalls that match with the guiding protrusions, and a fastener, wherein the lever arm passes through the spring, a through hole of the support beam, the slide slot, and the through holes of the rubber pad and the base to engage with the fastener, and pushing the knob downward and rotating the knob causes the rubber pad and the base to rotate along with the knob due to the guiding protrusions and matching recesses, and releasing the knob causes the spring to exert a press force that clamps the rubber pad towards a surface of the flange of the frame beam, thereby securing the support beam in position.

16. A computer cabinet, comprising:

a main frame including a plurality of frame beams;

a plurality of motherboard bracket assemblies, each motherboard bracket assembly including:

a support beam coupled to two opposing frame beams of the plurality of frame beams, the support beam having an elongated slide slot extending in a length direction of the support beam, the slide slot being formed in a body of the support beam, the slide slot being narrower at two ends of the slide slot than at a middle portion of the slide slot;

a first slider and a second slider that are elongated and disposed at opposing sides of the support beam, length directions of the first slider and the second slider being aligned with a length direction of the slide slot;

an elongated slide bracket arranged at an inner side of the support beam and extending along the length direction of the slide slot; and fasteners passing through the first slider, the second slider, and the slide slot to engage with the slide bracket, such that the first slider, the second slider, and the slide bracket are stacked successively in a direction perpendicular to the length direction of the slide slot and the support beam is sandwiched between the first slider and the second slider, wherein loosening the fasteners allows the first slider, the second slider, and the slide bracket to slide together along the slide slot for adjustable positioning of the slide bracket while the fasteners move in the slide slot in the length direction of the slide slot.

17. The computer cabinet of claim 16, further comprising:

a motherboard tray coupled to the plurality of motherboard bracket assemblies; and a backside panel coupled to at least two motherboard bracket assemblies of the plurality of motherboard bracket assemblies, wherein the slide bracket includes threaded holes and protrusions configured for mounting the motherboard tray and the backside panel, and the motherboard tray and the backside panel are repositionable by sliding the slide brackets along the slide slots of the respective motherboard bracket assemblies.

18. A computer cabinet, comprising:

a main frame including a plurality of frame beams, each frame beam having a flange including a slide slot and a guide rail;

a plurality of support beams; and for each support beam, a knob assembly configured to affix the support beam to a corresponding frame beam, the knob assembly including:

a knob having a lever arm with one or more guiding protrusions extending outward along an axial direction of the lever arm, a spring, a rubber pad having one or more protrusions extending downward and a through hole with recesses on sidewalls that match with the guiding protrusions, a base having openings that receive the protrusions of the rubber pad and a through hole with recesses on sidewalls that match with the guiding protrusions, and a fastener, wherein the lever arm passes through the spring, a through hole of the support beam, the slide slot, and the through holes of the rubber pad and the base to engage with the fastener, and pushing the knob downward and rotating the knob causes the rubber pad and the base to rotate along with the knob due to the guiding protrusions and matching recesses, and releasing the knob causes the spring to exert a press force that clamps the rubber pad towards a surface of the flange of the frame beam, thereby securing the support beam in position.

* * * * *